US008310001B2

(12) United States Patent
Darwish et al.

(10) Patent No.: US 8,310,001 B2
(45) Date of Patent: Nov. 13, 2012

(54) MOSFET SWITCH WITH EMBEDDED ELECTROSTATIC CHARGE

(75) Inventors: Mohamed N. Darwish, Campbell, CA (US); Jun Zeng, Torrance, CA (US)

(73) Assignee: MaxPower Semiconductor Inc., Santa Clara, CA (US)

(*) Notice: Subject to any disclaimer, the term of this patent is extended or adjusted under 35 U.S.C. 154(b) by 392 days.

(21) Appl. No.: 12/394,107

(22) Filed: Feb. 27, 2009

(65) Prior Publication Data

US 2010/0013552 A1    Jan. 21, 2010

Related U.S. Application Data

(60) Provisional application No. 61/080,702, filed on Jul. 15, 2008.

(51) Int. Cl.
    *H01L 29/94* (2006.01)
(52) U.S. Cl. . 257/330; 257/288; 257/329; 257/E29.197; 257/E29.257; 257/E29.26
(58) Field of Classification Search ............... 257/288, 257/328, 329, 330, E29.197, E29.198, E29.201, 257/E29.257, E29.26
    See application file for complete search history.

(56) References Cited

U.S. PATENT DOCUMENTS

| | | | |
|---|---|---|---|
| 5,282,018 A | 1/1994 | Hiraki et al. | |
| 5,637,898 A * | 6/1997 | Baliga | 257/330 |
| 5,864,159 A * | 1/1999 | Takahashi | 257/330 |
| 5,973,359 A | 10/1999 | Kobayashi | |
| 5,998,833 A | 12/1999 | Baliga | |
| 6,069,372 A | 5/2000 | Uenishi | |
| 6,114,727 A | 9/2000 | Ogura et al. | |
| 6,191,447 B1 | 2/2001 | Baliga | |
| 6,251,730 B1 | 6/2001 | Luo | |
| 6,388,286 B1 | 5/2002 | Baliga | |
| 6,509,233 B2 * | 1/2003 | Chang et al. | 438/270 |
| 6,525,373 B1 | 2/2003 | Kim | |
| 6,541,820 B1 | 4/2003 | Bol | |
| 6,649,975 B2 | 11/2003 | Baliga | |
| 6,686,244 B2 | 2/2004 | Blanchard | |
| 6,710,403 B2 | 3/2004 | Sapp | |
| 6,803,627 B2 | 10/2004 | Pfirsch | |
| 7,388,254 B2 * | 6/2008 | Kocon et al. | 257/330 |
| 7,514,743 B2 * | 4/2009 | Yang | 257/330 |
| 7,964,913 B2 * | 6/2011 | Darwish | 257/330 |
| 2001/0041407 A1 | 11/2001 | Brown | |
| 2002/0008284 A1 | 1/2002 | Zeng | |
| 2003/0203576 A1 | 10/2003 | Kitada et al. | |

(Continued)

OTHER PUBLICATIONS

Kimoto, et al., "Impact of Aggressively Shallow Source/Drain Extensions on Device Performance", published Jul. 8, 2005; URL: /http://jjap.ipap.jp/ling?JJap/44/4843/.

(Continued)

*Primary Examiner* — Eduardo A Rodela
(74) *Attorney, Agent, or Firm* — Robert O. Groover, III; Groover & Associates PLLC

(57) ABSTRACT

A vertical device structure includes a volume of semiconductor material, laterally adjoining a trench having insulating material on sidewalls thereof. A gate electrode within the trench is capacitively coupled through the insulating material to a first portion of the semiconducting material. Some portions of the insulating material contain fixed electrostatic charge in a density high enough to invert a second portion of the semiconductor material when no voltage is applied. The inverted portions can be used as induced source or drain extensions, to assure that parasitic are reduced without increasing on-resistance.

17 Claims, 41 Drawing Sheets

U.S. PATENT DOCUMENTS

| | | | |
|---|---|---|---|
| 2004/0072404 A1* | 4/2004 | Hshieh et al. | 438/270 |
| 2004/0173845 A1 | 9/2004 | Aoki | |
| 2006/0060916 A1 | 3/2006 | Girdhar et al. | |
| 2008/0073707 A1 | 3/2008 | Darwish | |
| 2008/0164516 A1* | 7/2008 | Darwish | 257/329 |

OTHER PUBLICATIONS

The International Search Report and the Written Opinion of the International Searching Authority, PC1YUS2009/035387, Sep. 30, 2009.

J. T. Watt, B. J. Fishbein & J. D. Plummer; Low-Temperature NMOS Technology with Cesium-Implanted Load Devices; IEEE Trans. Electron Devices, vol. 34, # 1, Jan. 1987; p. 28-38.

J.T.Watt,B.J.Fishbein & J.D.Plummer;Characterization of Surface Mobility in MOS Structures Containing Interfacial Cesium Ions;IEEE Trans.Electron Devices,V36,Jan. 1989; p. 96-100.

J.R.Pfiester, J.R.Alvis & C.D.Gunderson; Gain-Enhanced LDD NMOS Device Using Cesium Implantation; IEEE Trans.Electron Devices, V39, #6, Jun. 1992; p. 1469-1476.

* cited by examiner

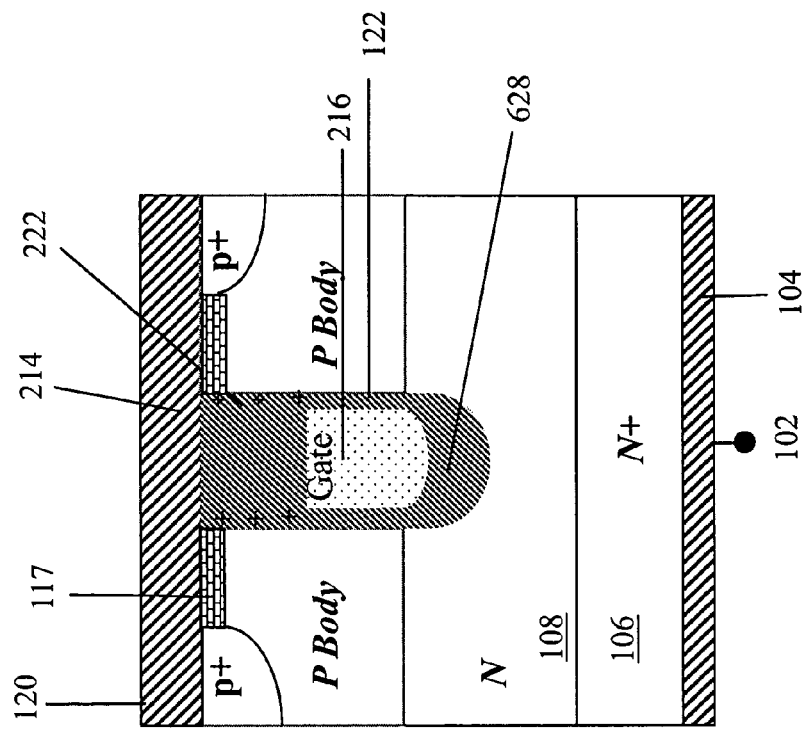
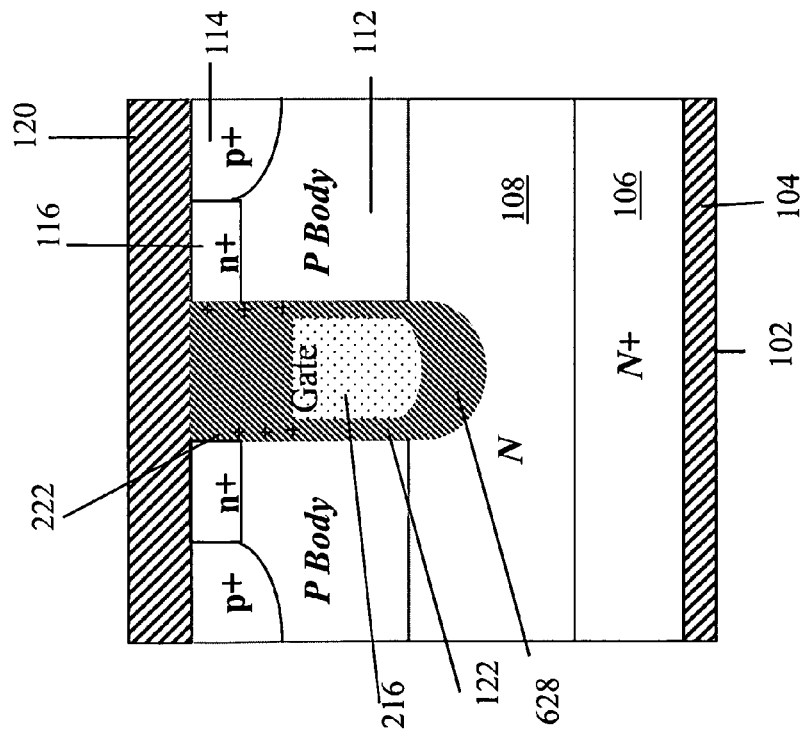
Figure 6(a)
Figure 6(b)

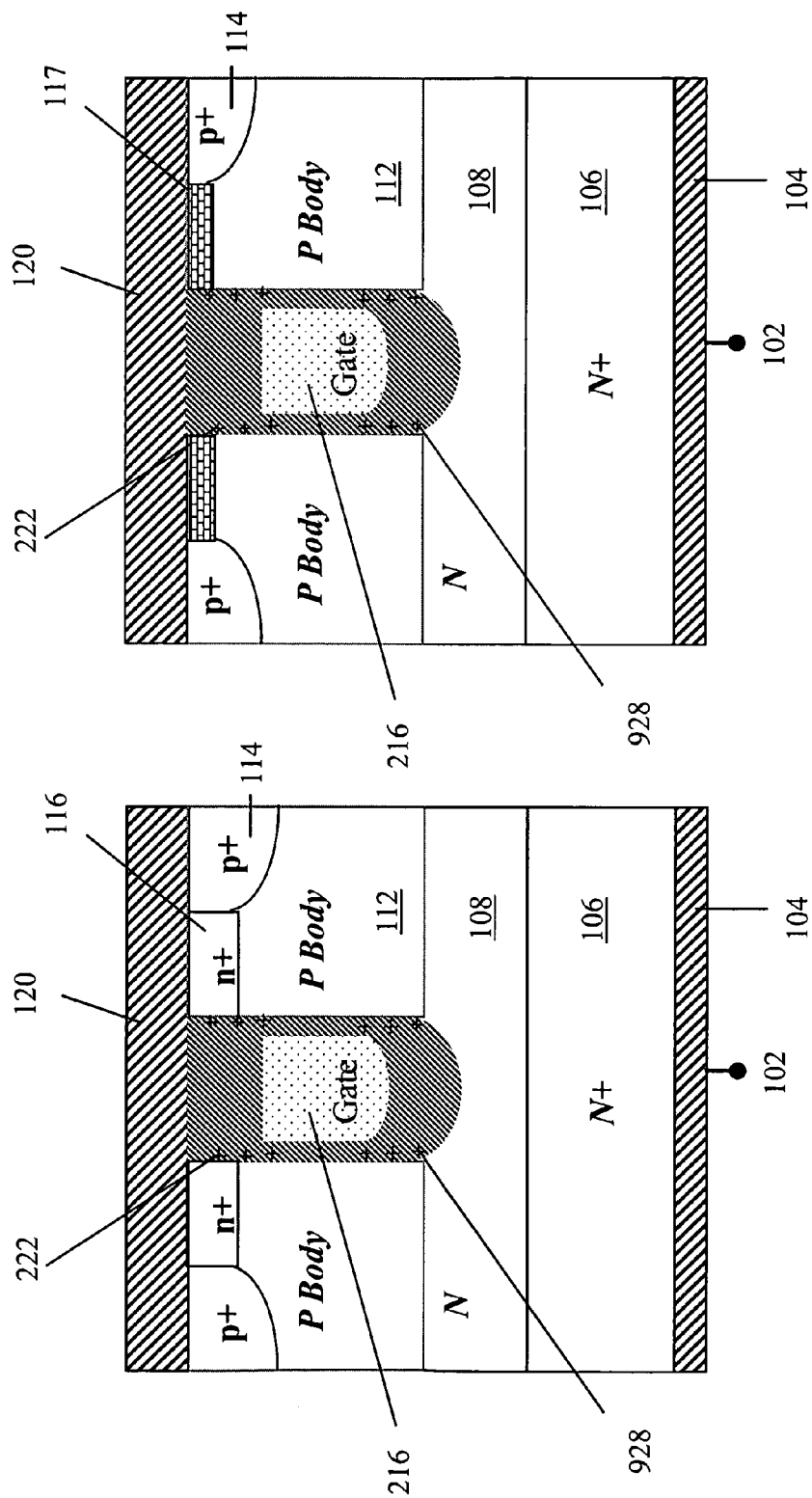

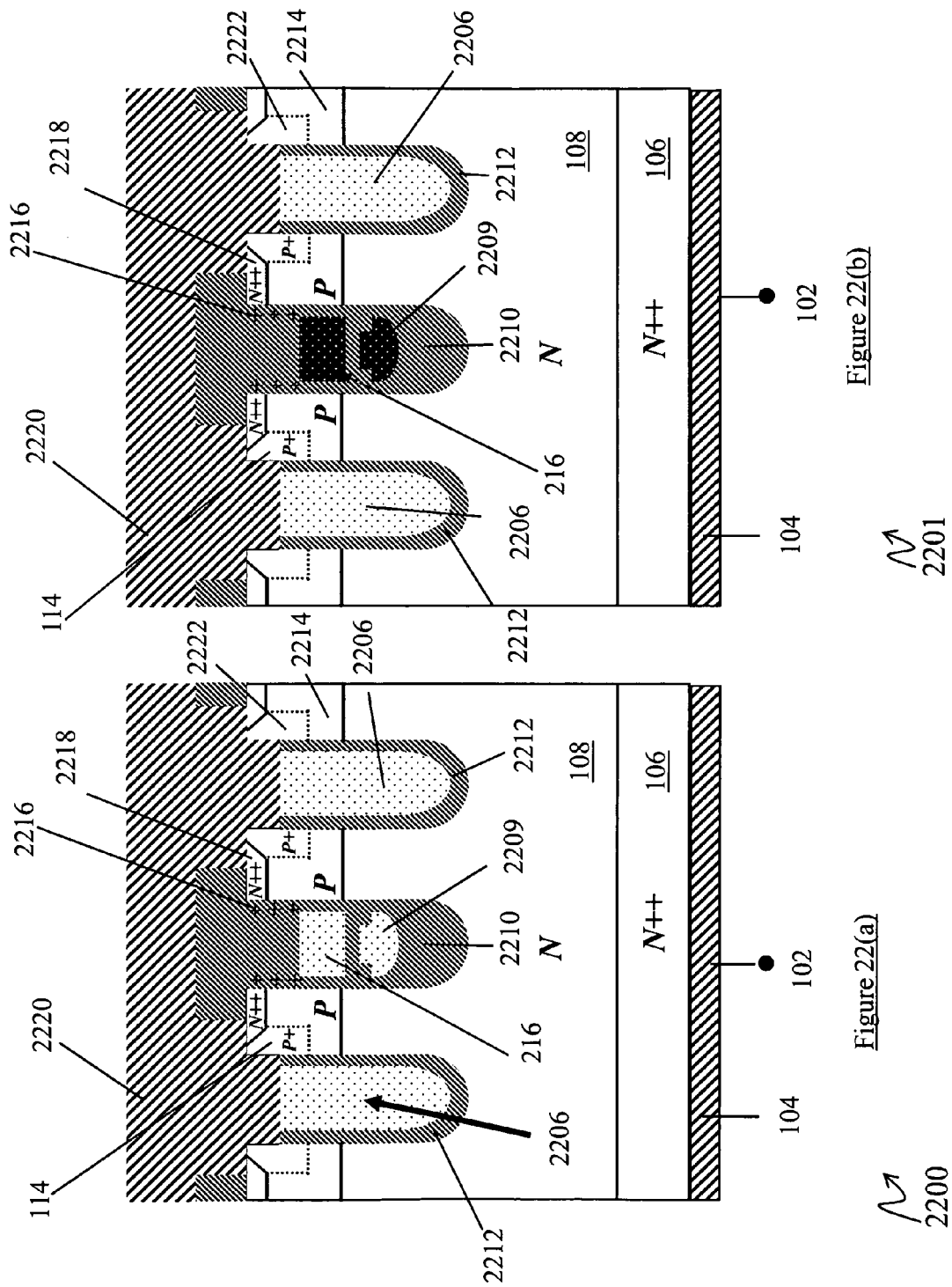

ial, in accordance with an embodiment;

MOSFET SWITCH WITH EMBEDDED ELECTROSTATIC CHARGE

CROSS-REFERENCE TO OTHER APPLICATION

Priority is claimed from U.S. provisional application 61/080,702 filed Jul. 15, 2008, which is hereby incorporated by reference.

BACKGROUND

The present application relates to MOSFET switches, and more particularly to MOSFET switches having permanent charges.

Note that the points discussed below may reflect the hindsight gained from the disclosed inventions, and are not necessarily admitted to be prior art.

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 6(a) is a cross-sectional view depicting a trench MOSFET having a gate-n+ source offset and thick bottom oxide, in accordance with an embodiment;

FIG. 6(b) is a cross-sectional view depicting a trench MOSFET having a gate-Schottky Barrier source offset and thick bottom oxide, in accordance with an embodiment;

FIG. 12(a) is a cross-sectional view depicting a trench MOSFET having a gate-n+ source and gate/p-body-drain junction offset, in accordance with an embodiment;

FIG. 12(b) is a cross-sectional view depicting a trench MOSFET having a gate-Schottky Barrier source and gate/p-body-drain junction offset, in accordance with an embodiment;

FIG. 22(a) is a cross-sectional view depicting a trench MOSFET having gate-n+ source offset, recessed field plates and a polysilicon shield layer connected to the source, in accordance with an embodiment;

FIG. 22(b) is a cross-sectional view depicting a trench MOSFET having recessed field plates and double polycide layers, in accordance with an embodiment;

DETAILED DESCRIPTION OF SAMPLE EMBODIMENTS

Power MOSFETs are widely used as switching devices in many electronic applications. To minimize conduction power loss, power MOSFETs are designed to minimize the specific on-resistance. Specific on-resistance (Rsp) may be defined as the product of the on-resistance (Ron) and the area of a device (A), such that Rsp=Ron*A.

Figure 1:
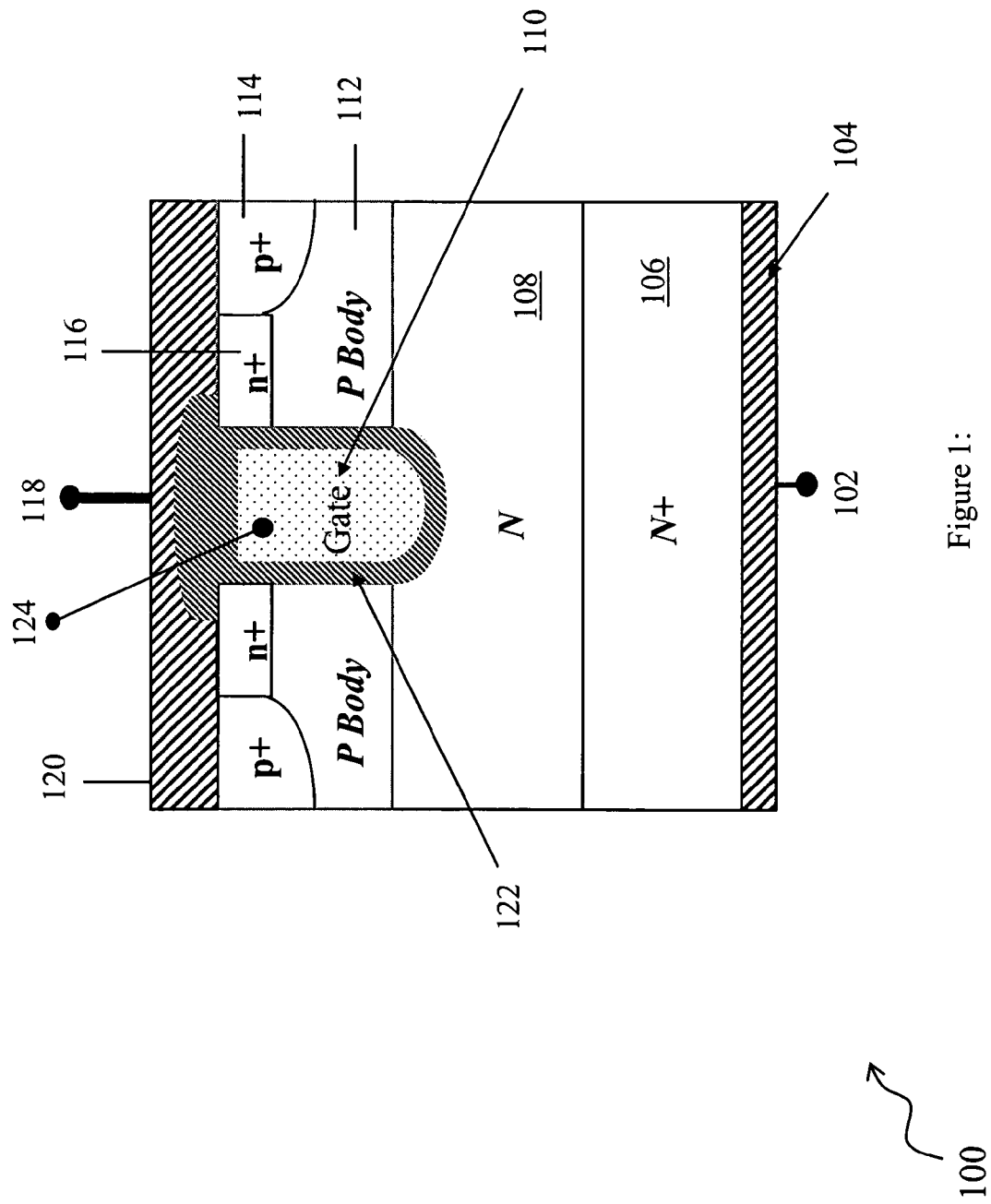
FIG. 1 is a cross-sectional view depicting a trench MOSFET in accordance with the prior art.

A schematic cross-section of a conventional trench MOSFET 100 is shown in FIG. 1. MOSFET 100 may be characterized as having a drain lead 102 on a backside contact 104. A heavily doped deep-drain region 106 adjoins the backside contact 104. Drain region 108 is separated from a source 116 by a body 112. A gate insulation layer 122 is formed in a trench containing a gate 110. Gate insulation layer 122 may border the source and body region metallization 120, which also contacts source region 116 and p+ body contact 114. Source lead 118 and gate lead 124 are also electrically connected (though the physical elements of these are not all visible in this drawing).

The trench MOSFET 100 typically provides a lower specific on-resistance (Rsp) as the cell pitch decreases, due to high packing density or a larger number of cells per unit area. However, as the cell density increases, the associated capacitances such as gate drain capacitance (Cgd) and gate source capacitance (Cgs) also increase.

The use of permanent or fixed charges has been demonstrated to be useful to fabricate devices such as depletion mode vertical DMOS transistors and solar cells. Such charges can be supplied, for instance, by these implantation of certain atomic species or the use of dielectric layers such as plasma-enhanced CVD silicon nitride or a combination of silicon oxide and aluminum fluoride (AlF3).

A vertical device structure includes a volume of semiconductor material, laterally adjoining a trench having insulating material on sidewalls thereof. A gate electrode within the trench is capacitively coupled through the insulating material to a first portion of the semiconductor material. Some portions of the insulating material contain fixed electrostatic charge in a density high enough to invert a second portion of the semiconductor material when no voltage is applied.

The numerous innovative teachings of the present application will be described with particular reference to presently preferred embodiments (by way of example, and not of limitation).

The present application shows how power MOSFET structures may be designed to have gate-to-source, gate-to-drain, or both gate-to-source and gate-to-drain offsets. The power MOSFET structures can include charge induced junctions, which operate as induced source extensions or drain extensions. Using dielectric layers that have intentionally introduced permanent (fixed) charge creates an inversion layer at the silicon-dielectric layer interface. The inversion charge forms an induced junction that allows the use of shorter channel lengths and provides lower specific on-resistance (Rsp) This permits the gate electrode to be separated so that it does not overlap the drain and/or source regions. This also permits the use of Schottky Barrier source which provides a shallower and abrupt junction than diffused junctions. Such configurations can result in a shorter channel length, and hence lower Rsp, lower gate-to-drain capacitance (Cgd) and gate-to-source capacitance (Cgs), or lower gate-drain charge (Qgd) and gate charge (Qg). In various embodiments, both negative and positive charges may be used to provide these induced junctions.

Reduced Rsp, Qg and Qgd help to reduce power loss in a power MOS transistor, as is increasingly needed.

Figure 2:
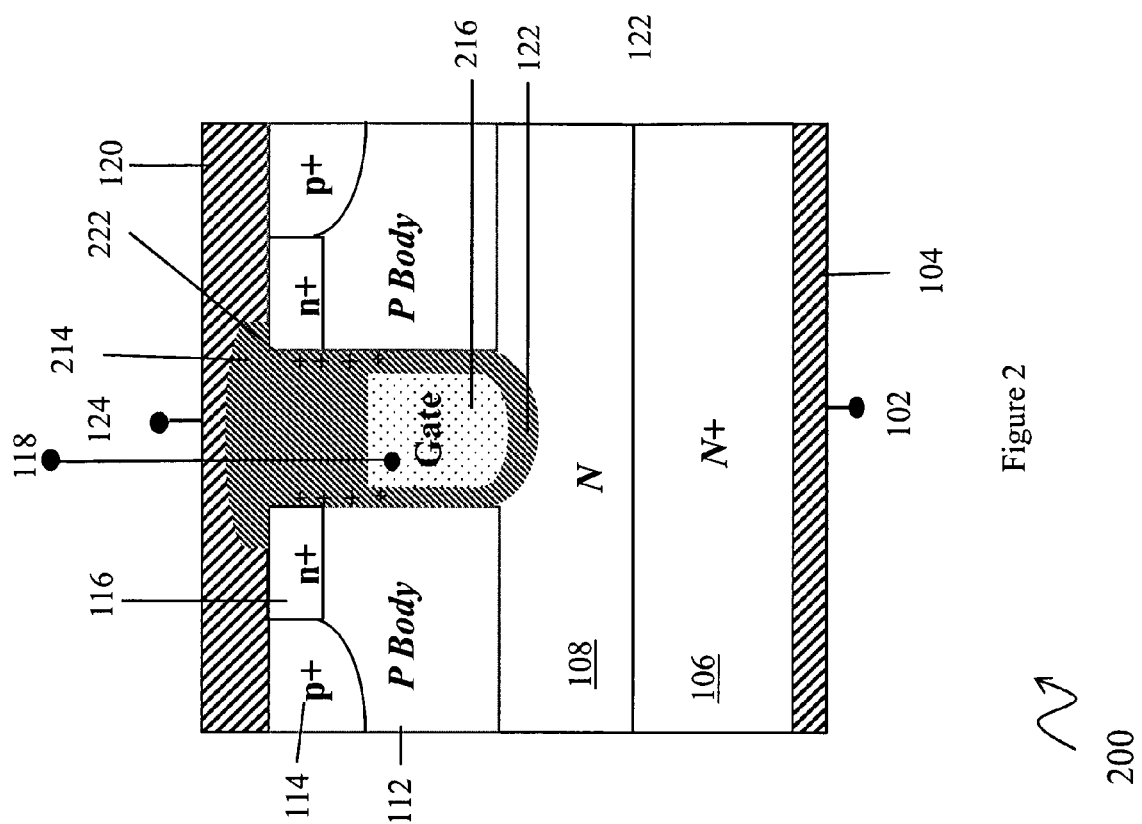
FIG. 2 is a cross-sectional view depicting a trench MOSFET having a gate-n+ source offset, in accordance with an embodiment.

With reference to FIG. 2, a cross-sectional view depicts an n-channel MOSFET 200 having a gate-source offset in accordance with a sample innovative embodiment. Note that the gate electrode 216 is vertically offset from the source 116, so that the gate electrode 216 does not horizontally line up with the source/body junction 116/112. Drain (drift region) 108 is separated from source 116 by a body 112. A gate insulation layer 122 is formed in a trench containing the gate 216. (In the example shown, the insulation layer 122 extends upward into a "nailhead" shape dielectric layer 214, which can comprise a different material compared to 122.) Gate insulation layer 122 may border the source and body metallization 120, which also contacts source region 116 and p+ body contact 114. Permanent charge 222 is embedded in the gate insulation layer 122 (optional along the full trench gate), particularly along the junction between the gate insulation layer 214, the body 112 and the source 116. As in FIG. 1, source and body lead 118 and gate lead 124 are schematically shown, even though they are not physically visible in the cross-section shown.

The presence of an embedded permanent charge 222 in the gate insulation layer 214 results in an inversion layer in the adjacent portion of the body 112. The inversion layer forms a charge induced junction, providing a path of reduced resistance for electron flow from the source 116 to drain 104. Since the depth of the induced junction (the inversion layer) may be very shallow (on the order of 10 nm), short channel effects can be significantly reduced.

Figure 3:
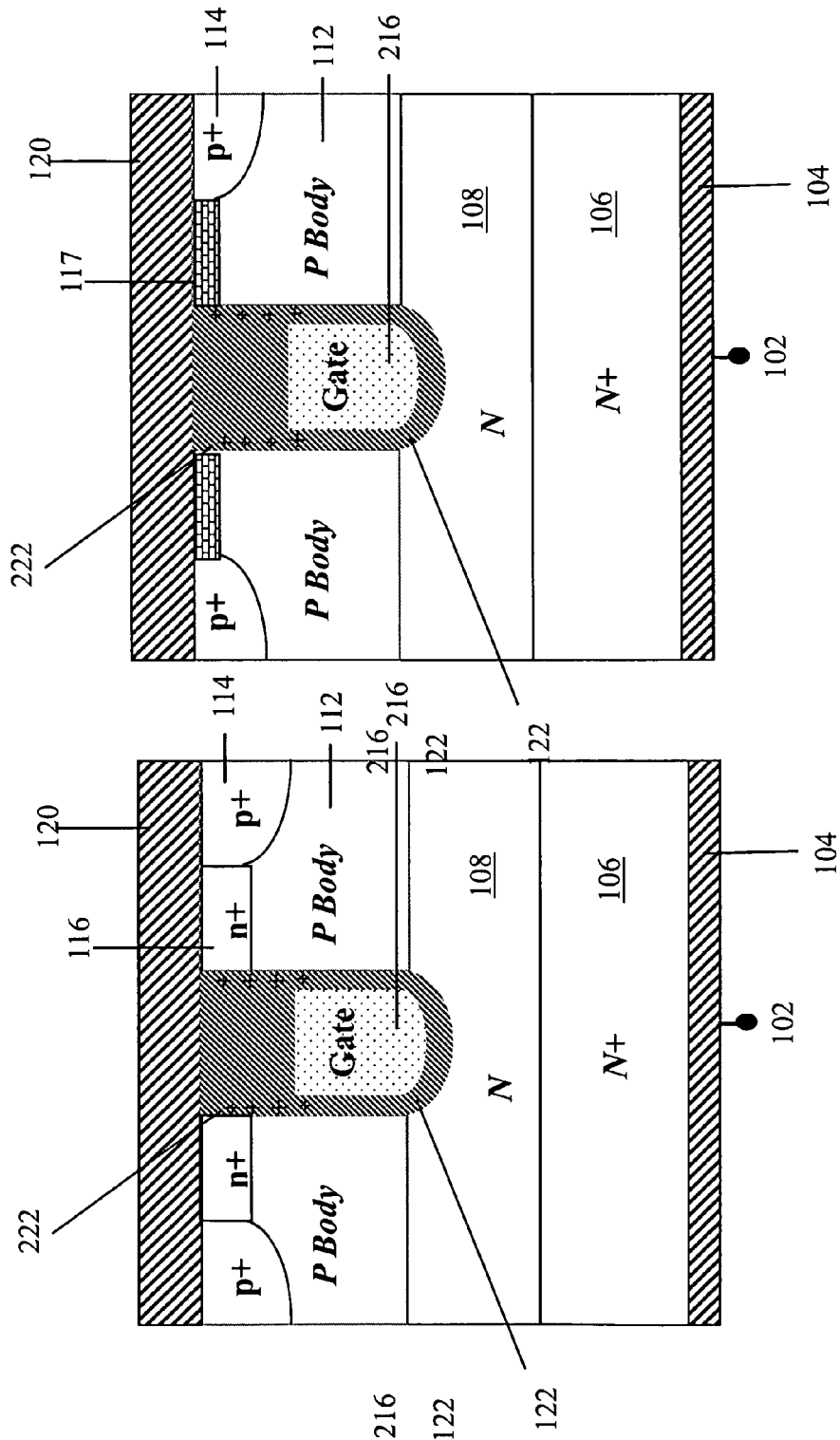
FIG. 3(a) is a cross-sectional view depicting a trench MOSFET having a gate-n+ source offset, in accordance with an embodiment.
FIG. 3(b) is a cross-sectional view depicting a trench MOSFET having a gate-Schottky Barrier source offset, in accordance with an embodiment.

With reference to FIG. 3(a), a cross-sectional view depicts a power MOSFET 300 in accordance with another embodiment. This embodiment is generally similar to the device 200, except that the oxide over the gate is not extended into the nailhead shape seen in FIG. 2. Again, note that the gate 216 does not line up with the plane of the source/body junction. Other elements are generally similar to those of the preceding drawings, and are generally numbered the same.

With reference to FIG. 3(b), a cross-sectional view depicts a power MOSFET 301 in accordance with another embodiment. This embodiment is generally similar to the device 300, except a Schottky Barrier source 117 is used instead of the n+ source 116 seen in FIG. 3(a). Other elements are generally similar to those of the preceding drawings, and are generally numbered the same.

Figure 4:
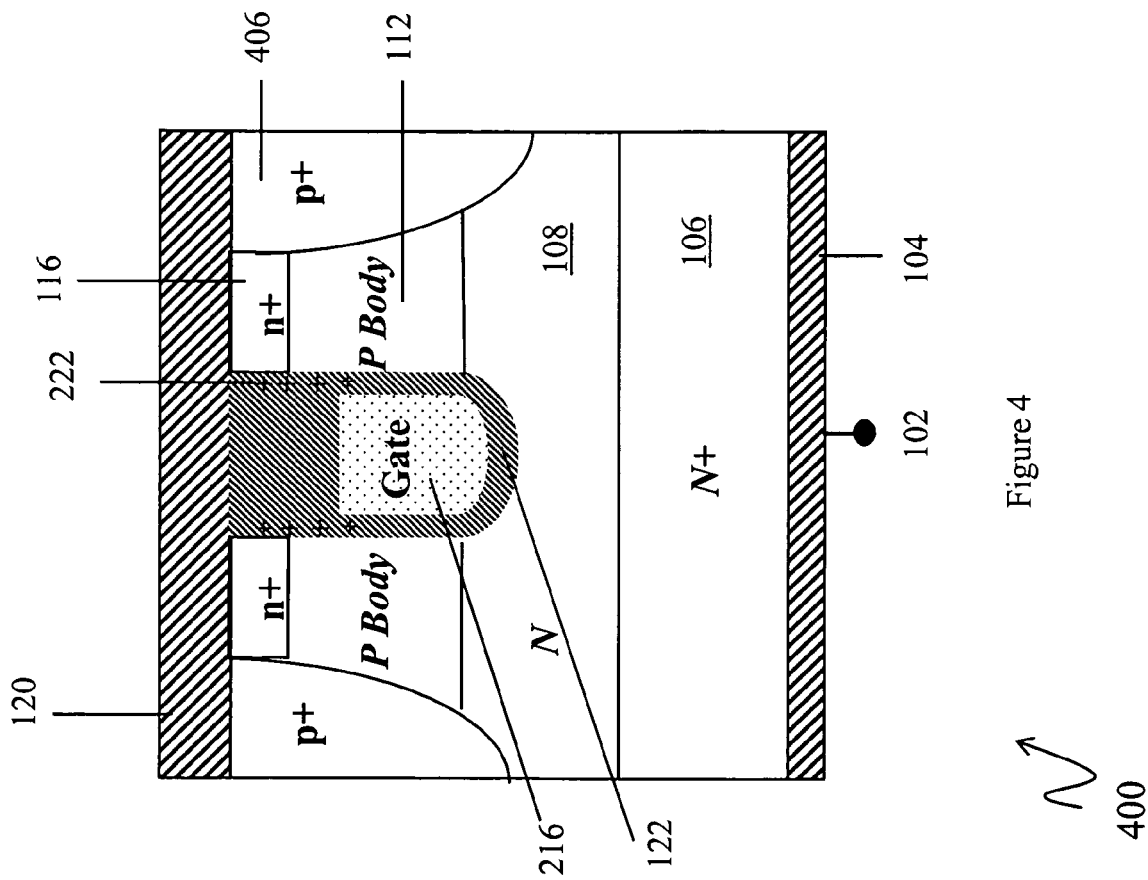
FIG. 4 is a cross-sectional view depicting a trench MOSFET having a gate-n+ source offset and a deep P+ junction, in accordance with an embodiment.

FIG. 4 is a cross-sectional view of another alternative power MOSFET embodiment 400. In this embodiment a deep body contact diffusion 406 is used instead of the p+ diffusion 114 of previous figures. Other elements are generally similar to those of the preceding drawings, and are generally numbered the same. Here too the permanent charges 222 invert a portion of the body 112, to create an induced source extension which connects the source to the channel.

Figures 5A, 5B:
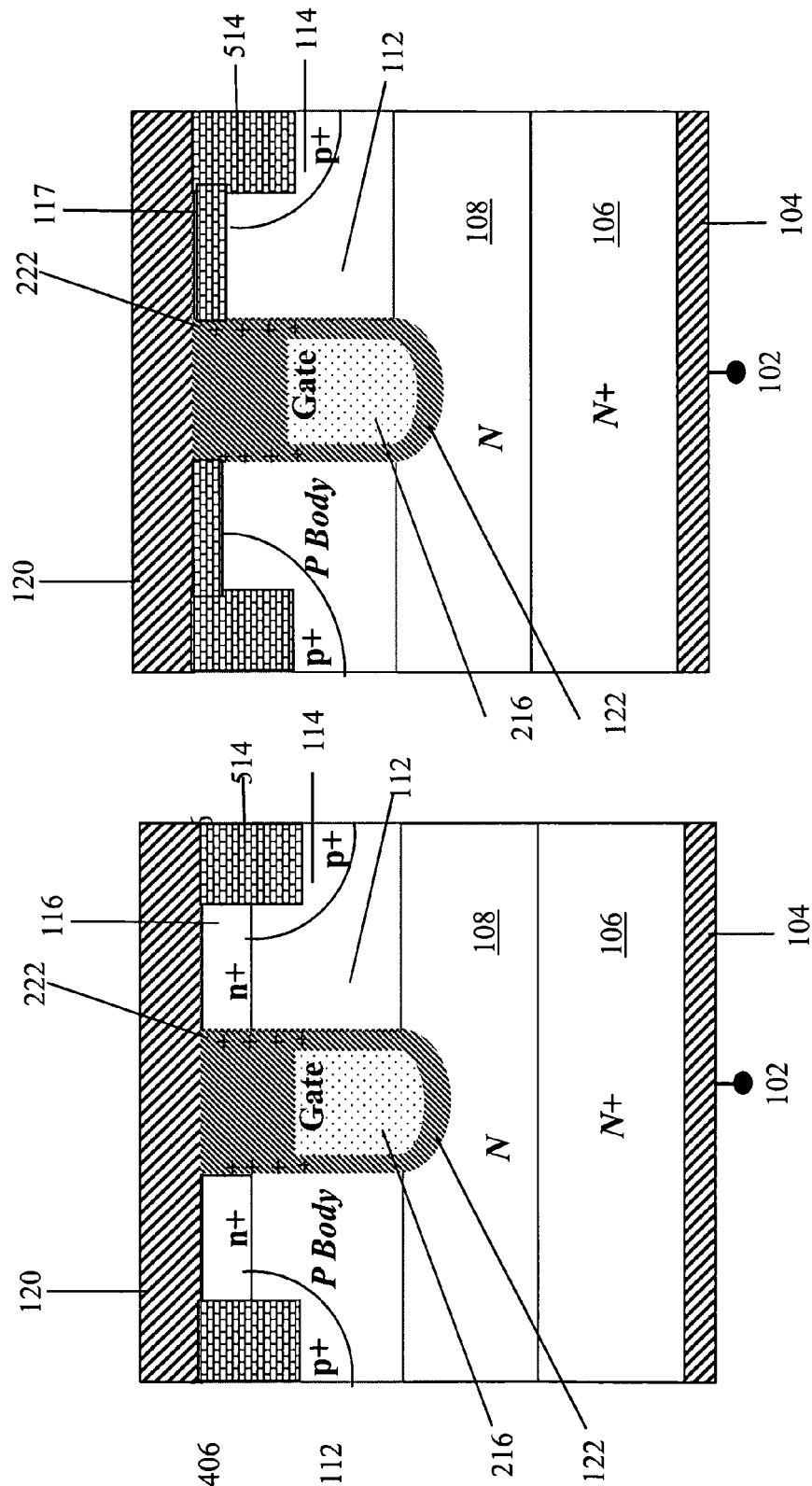
FIG. 5(a) is a cross-sectional view depicting a trench MOSFET having a gate-n+ source offset and trench contact, in accordance with an embodiment.
FIG. 5(b) is a cross-sectional view depicting a trench MOSFET having a gate-Schottky Barrier source offset and trench contact, in accordance with an embodiment.

FIG. 5(a) depicts a power MOSFET 500 in accordance with yet another embodiment. In this embodiment a trench contact 514 makes contact to the p+ body contact diffusion 114, which accordingly is located deeper than in previous figures. The trench contact 514 can be, for example, a trench filled with tungsten. Other elements are generally similar to those of the preceding drawings, and are generally numbered the same. Here too the permanent charges 222 invert a portion of the body 112, to create an induced source extension which connects the source to the channel.

FIG. 5(b) depicts a power MOSFET 501 in accordance with another device embodiment, which is generally quite similar to that of FIG. 5(a), except that a Schottky Barrier source 117 is used instead of n+ source 116. Other elements are generally similar to those of the preceding drawings, and are generally numbered the same.

FIG. 6(a) shows yet another alternative embodiment, which is generally similar to that of FIG. 2, except that the dielectric over the gate electrode is approximately coplanar with the surface of the semiconductor and additional thick oxide 628 is present on the bottom of the trench, below the gate electrode. Other elements are generally similar to those of FIG. 2, and are generally numbered the same.

FIG. 6(b) depicts a power MOSFET 601 in accordance with another device embodiment, which is generally quite similar to that of FIG. 6(a), except that a Schottky Barrier source 117 is used instead of n+ source 116. Other elements are generally similar to those of the preceding drawings, and are generally numbered the same.

Figure 7A:
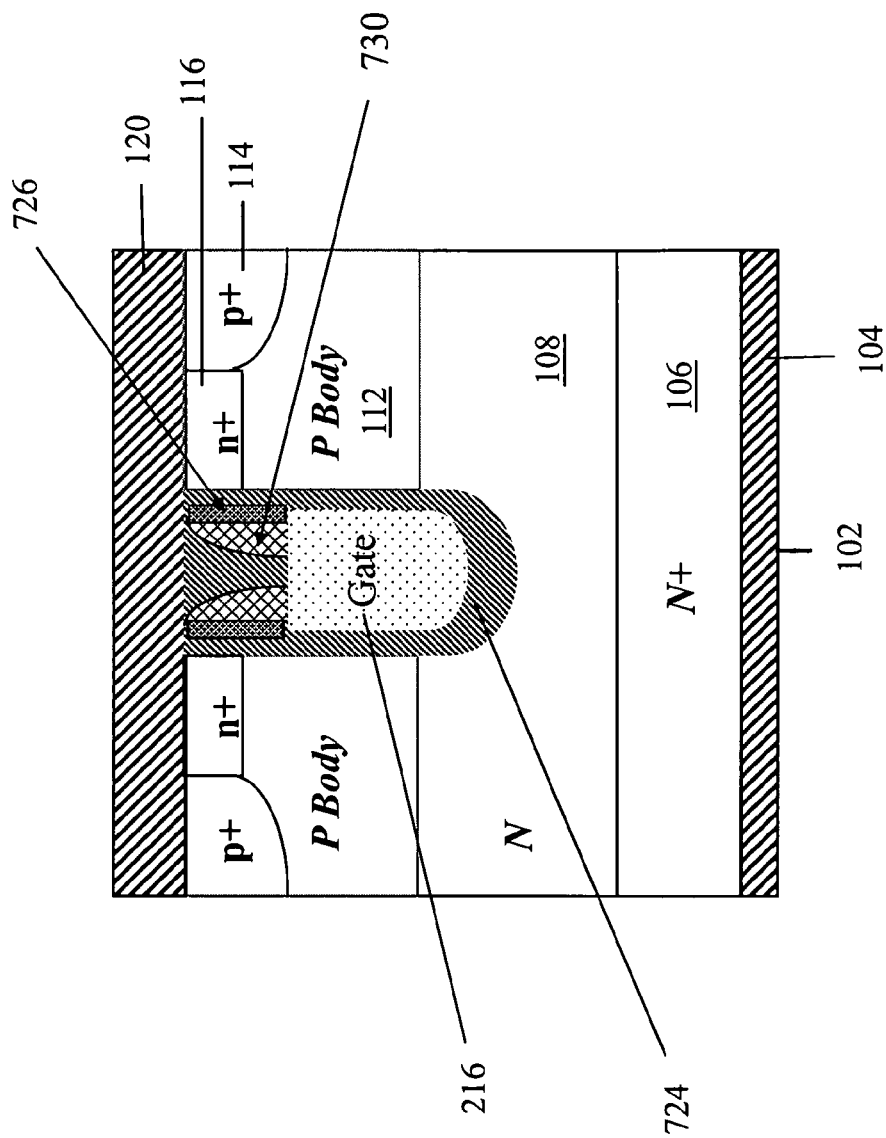
FIG. 7(a) is a cross-sectional view depicting a trench MOSFET having a gate-n+ source offset, thick bottom oxide and additional dielectric layers, in accordance with an embodiment.

FIG. 7(a) shows another alternative embodiment 700, in which the permanent charge is provided by a dielectric interface rather than by sidewall-implanted ions. In this example, additional dielectric layers 730 and 726 within the trench may provide permanent charges. Dielectric layers 730 and 726 can be, for example, silicon oxynitride and silicon nitride. Alternatively, the dielectric layers 730 and 726 can be made be of the same material, as long as their deposition conditions provide the desired permanent charge. Other elements are generally similar to those of the preceding drawings, and are generally numbered the same.

Figure 7B:
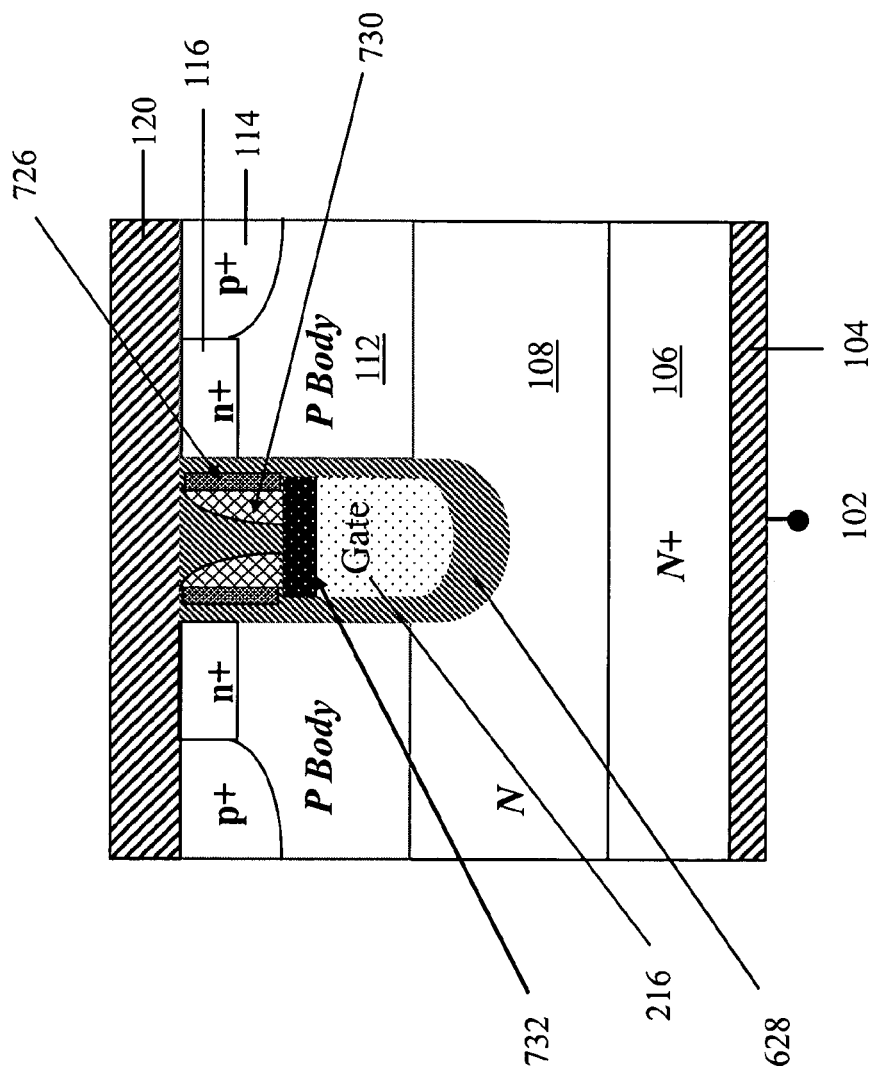
FIG. 7(b) is a cross-sectional view depicting a trench MOSFET having a gate-n+ source offset, thick bottom oxide, additional dielectric layers and gate polycide gate material, in accordance with an embodiment.

FIG. 7(b) shows yet another alternative embodiment, in which the gate electrode 216 is overlain with a metal silicide layer 732, to improve sheet resistance of the gate. Other elements are generally similar to those of FIG. 7(b), and are generally numbered the same.

Figure 8A:
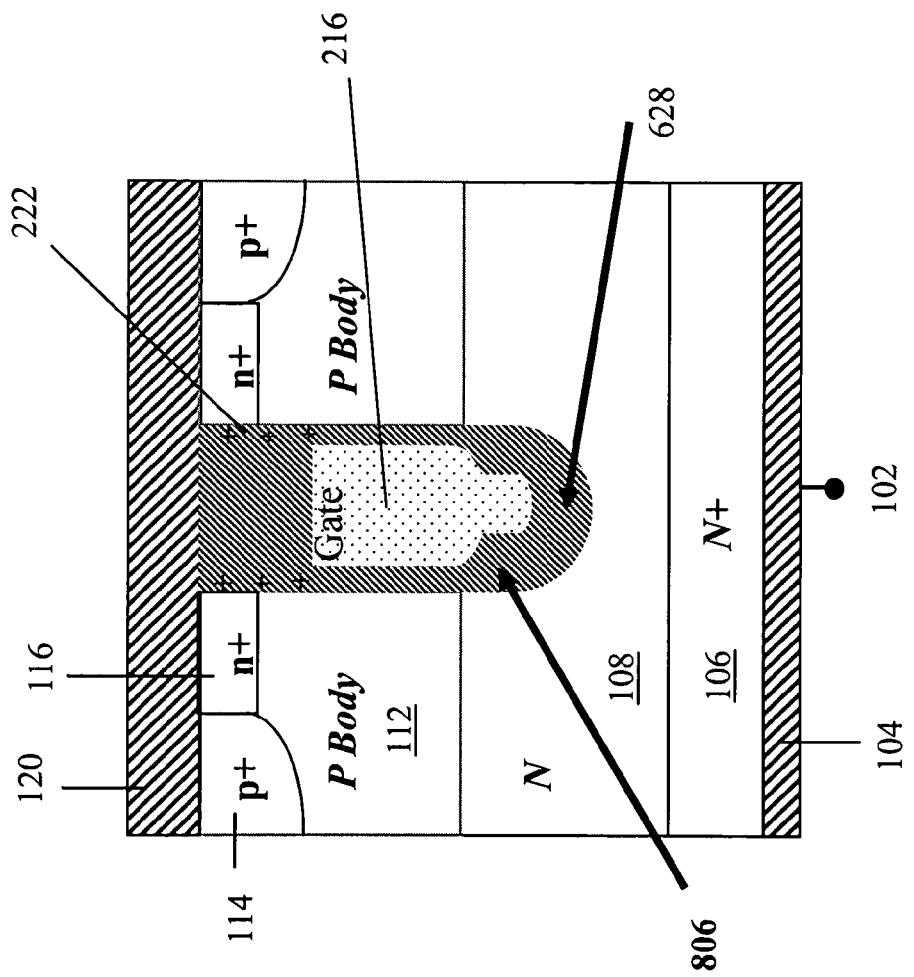
FIGS. 8(a) and 8(b) are cross-sectional views depicting a trench MOSFET having a smooth transition region between the gate oxide and a thick bottom oxide, in accordance with an embodiment.

FIG. 8(a) shows a power MOSFET 800 in accordance with yet another embodiment. The power MOSFET 800 may include a smooth transition region 806 between the gate insulation layer 122 and a thicker bottom oxide 628. This geometry, and the illustrated downward extension of the gate electrode, help to reduce electric field problems near the bottom corner of the gate electrode. Other elements are generally similar to those of the preceding drawings, and are generally numbered the same.

Figure 8B:
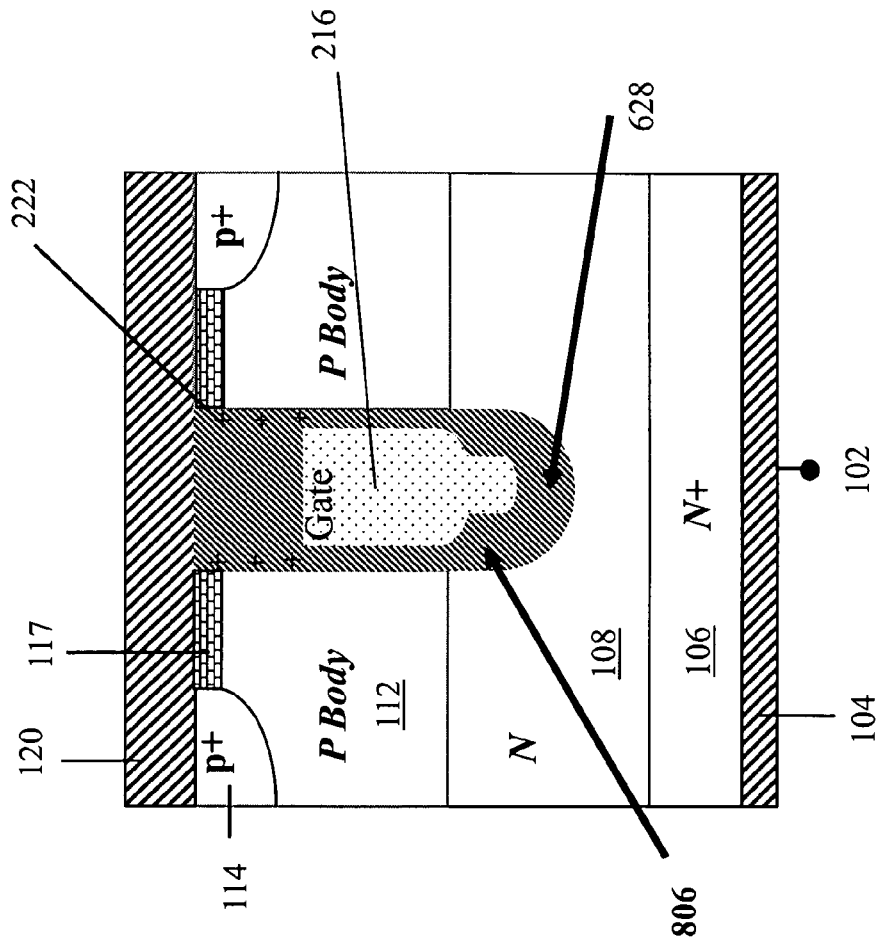

FIG. 8(b) depicts a power MOSFET 801 in accordance with another device embodiment, which is generally quite similar to that of FIG. 8(a), except that a Schottky Barrier source 117 is used instead of n+ source 116. Other elements are generally similar to those of the preceding drawings, and are generally numbered the same.

Figure 9A:
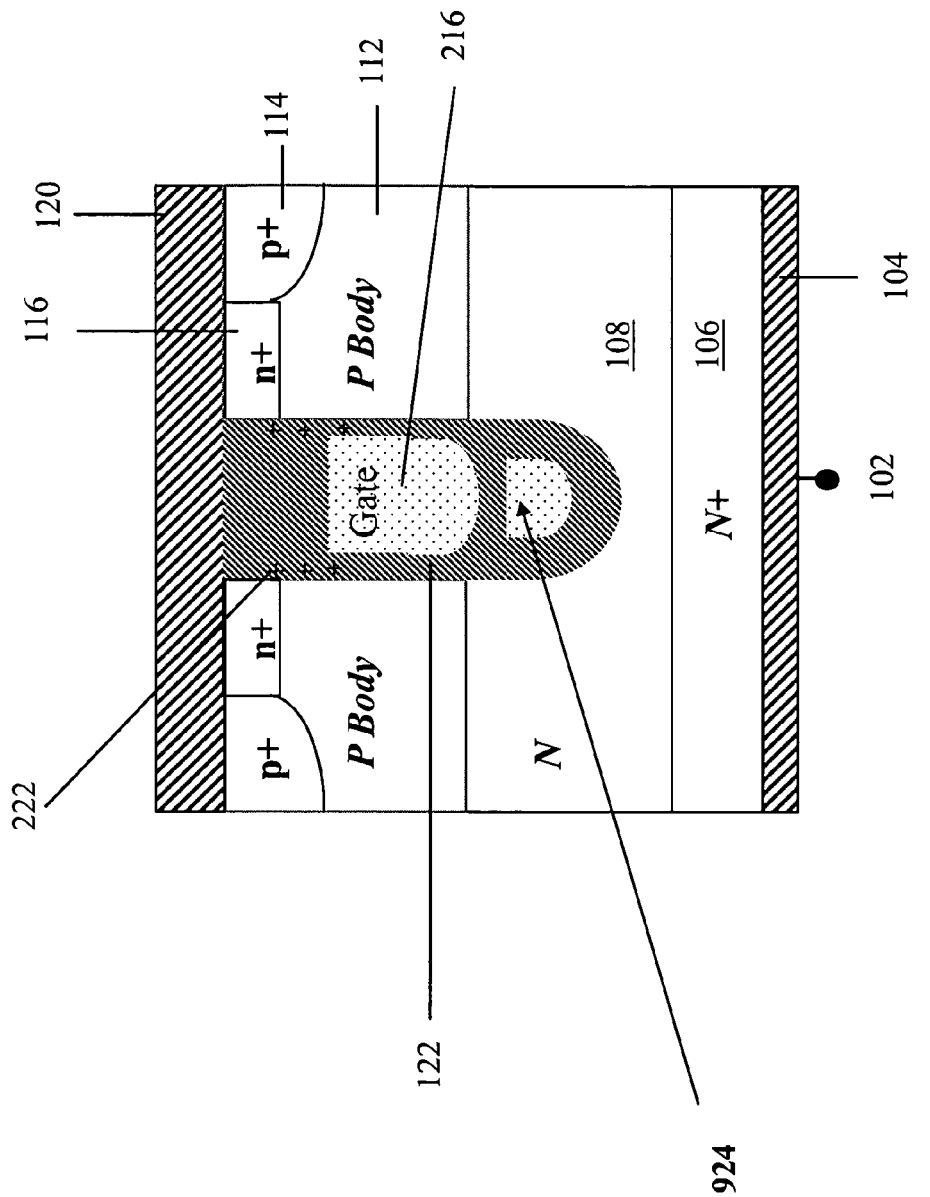
FIG. 9(a) is a cross-sectional view depicting a trench MOSFET having a gate-n+ source offset and polysilicon shield layer connected to source, in accordance with an embodiment.

FIG. 9(a) shows a power MOSFET 900 in accordance with yet another embodiment. In this embodiment a split-gate structure is used, with the lower electrode 924 typically tied to source potential. Note that, in this example, the sidewall insulation at lower gate electrode 924 is thicker than that at the control gate 216. Other elements are generally similar to those of the preceding drawings, and are generally numbered the same.

Figure 9B:
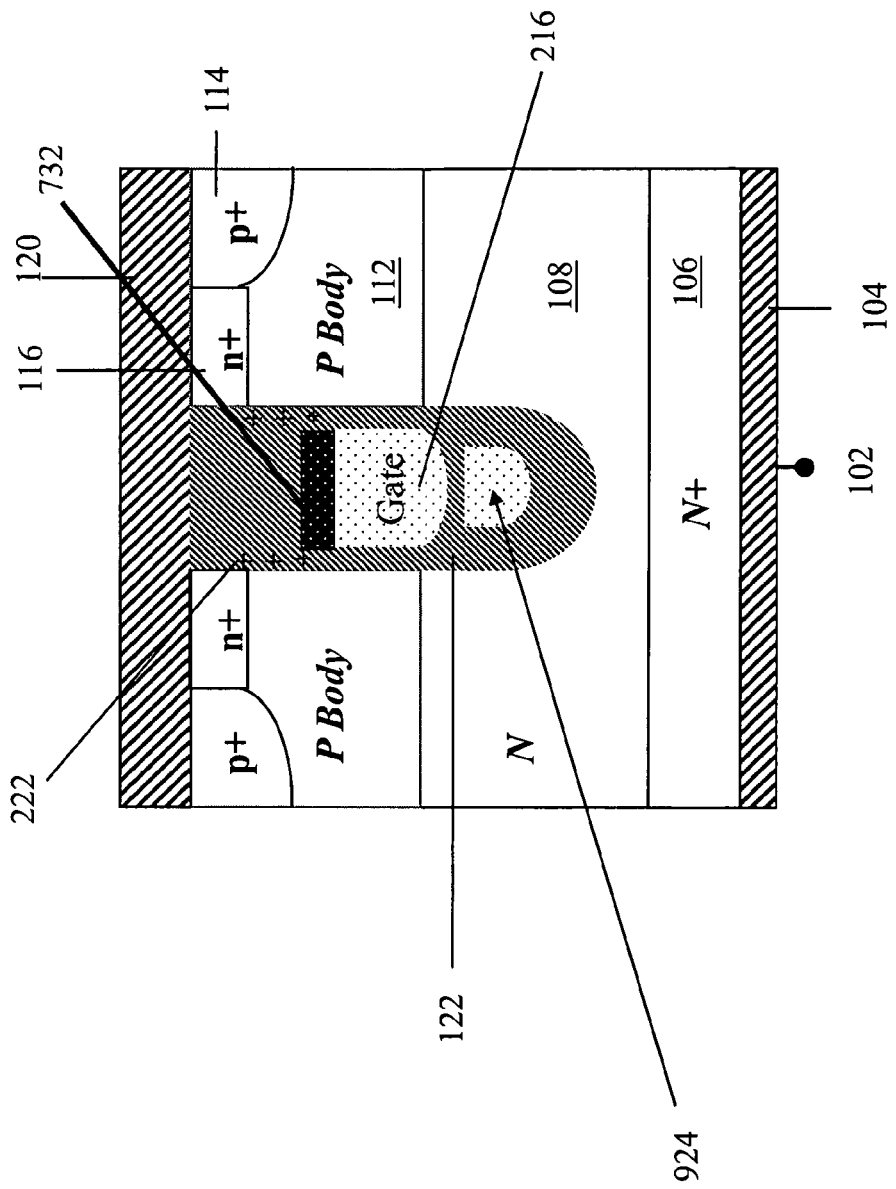
FIG. 9(b) is a cross-sectional view depicting a trench MOSFET having a gate-n+ source offset, polysilicon shield layer connected to source and gate polycide gate material, in accordance with an embodiment.

FIG. 9(b) shows another split-gate embodiment, in which a silicide layer 732 overlies the gate electrode 216. Other elements are generally similar to those of the preceding drawings, and are generally numbered the same.

Figure 9C:
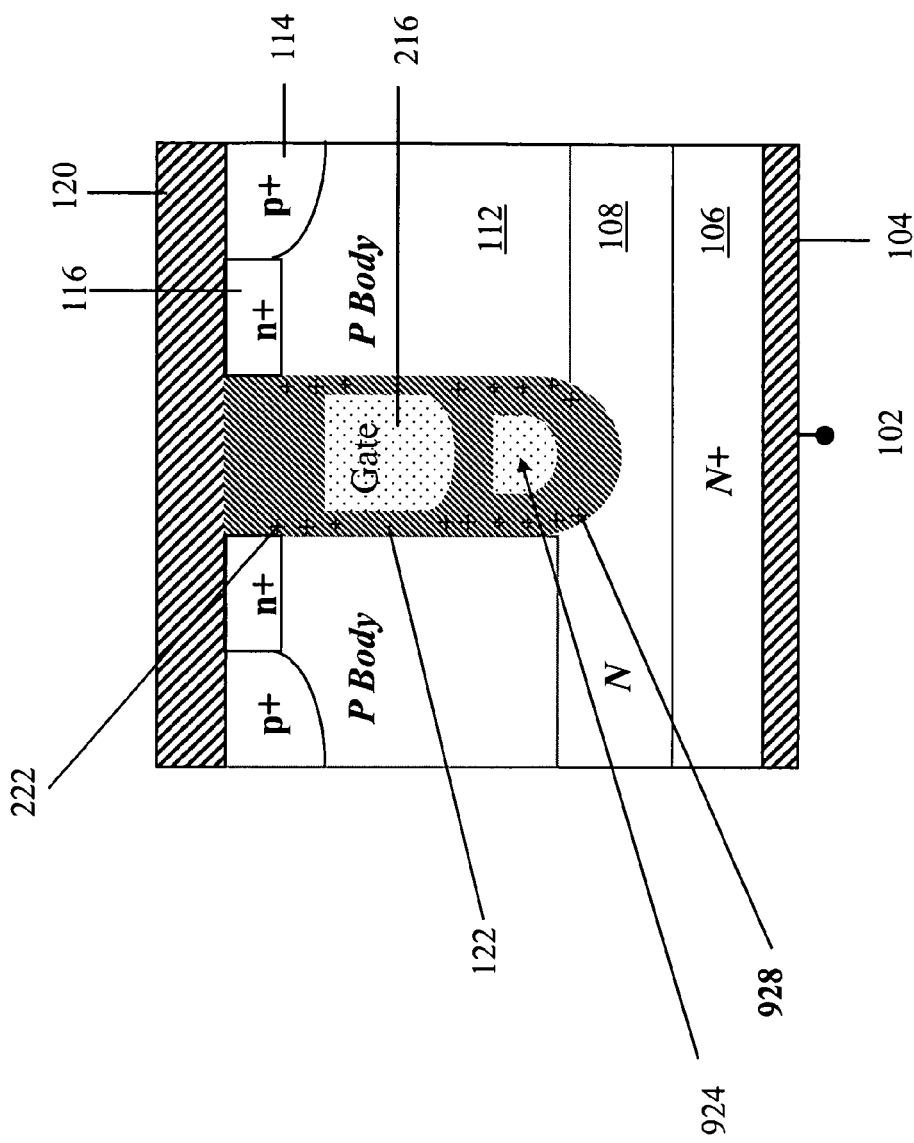
FIG. 9(c) is a cross-sectional view depicting a trench MOSFET having a gate-n+ source offset, a polysilicon shield layer connected to the source and a gate p-body-drain junction offset, in accordance with an embodiment.

FIG. 9(c) is the first example of an important class of embodiments. Notice that in this embodiment, the device structure 903 not only has permanent charge 222 which creates an induced source extension, but also has additional permanent charge 928 which creates an induced drain extension. This allows the control gate 216 to be vertically offset from the body/drain junction 112/108, since the induced drain extension allows continuity of electron flow. Other elements are generally similar to those of the preceding drawings, and are generally numbered the same. Note that this embodiment shows two sets of permanent charges, for inducing both source and drain extensions, but alternatively either can be used without the other. They can also be merged into one. In these embodiments the p-body doping can be increased in the channel region.

Figure 9D:
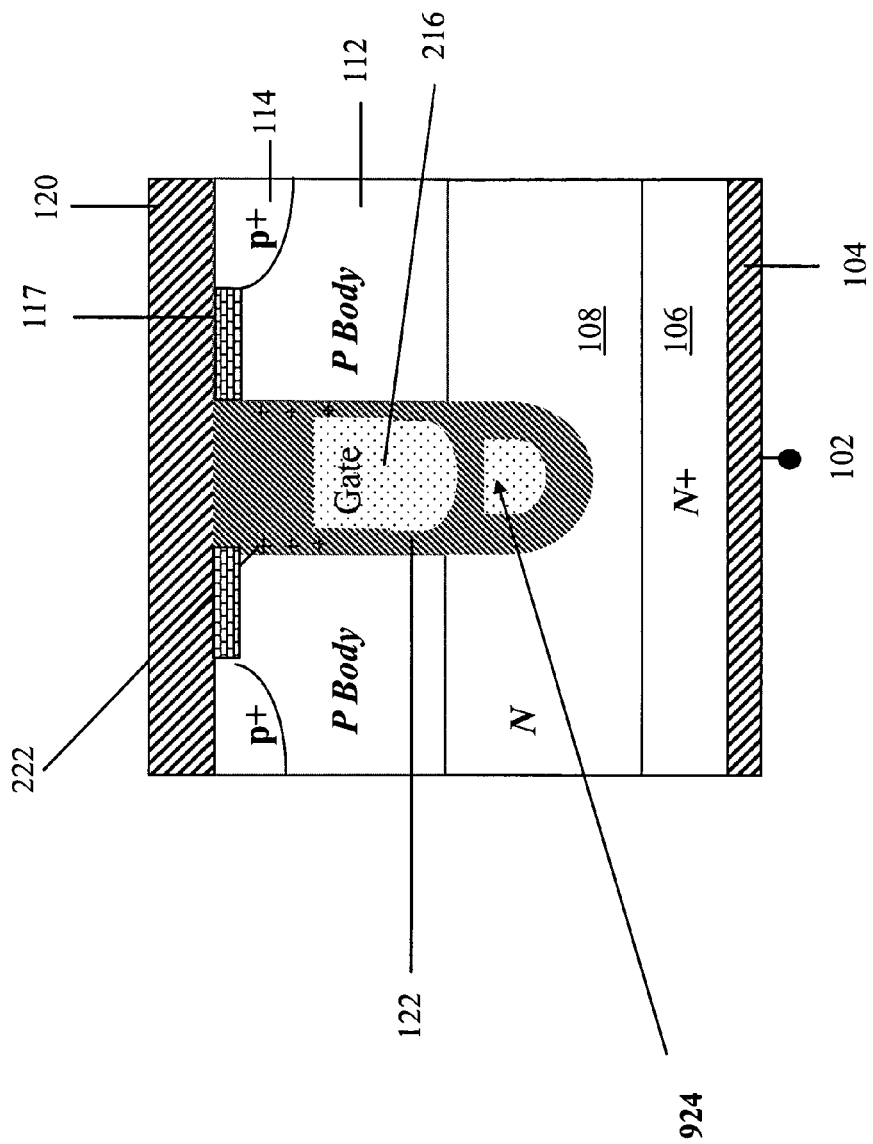
FIG. 9(d) is a cross-sectional view depicting a trench MOSFET having a gate-Schottky Barrier source offset and polysilicon shield layer connected to source, in accordance with an embodiment.

FIG. 9(d) depicts a power MOSFET 904 in accordance with another device embodiment, which is generally quite similar to that of FIG. 9(a), except that a Schottky Barrier source 117 is used instead of n+ source 116. Other elements are generally similar to those of the preceding drawings, and are generally numbered the same.

Figure 9E:
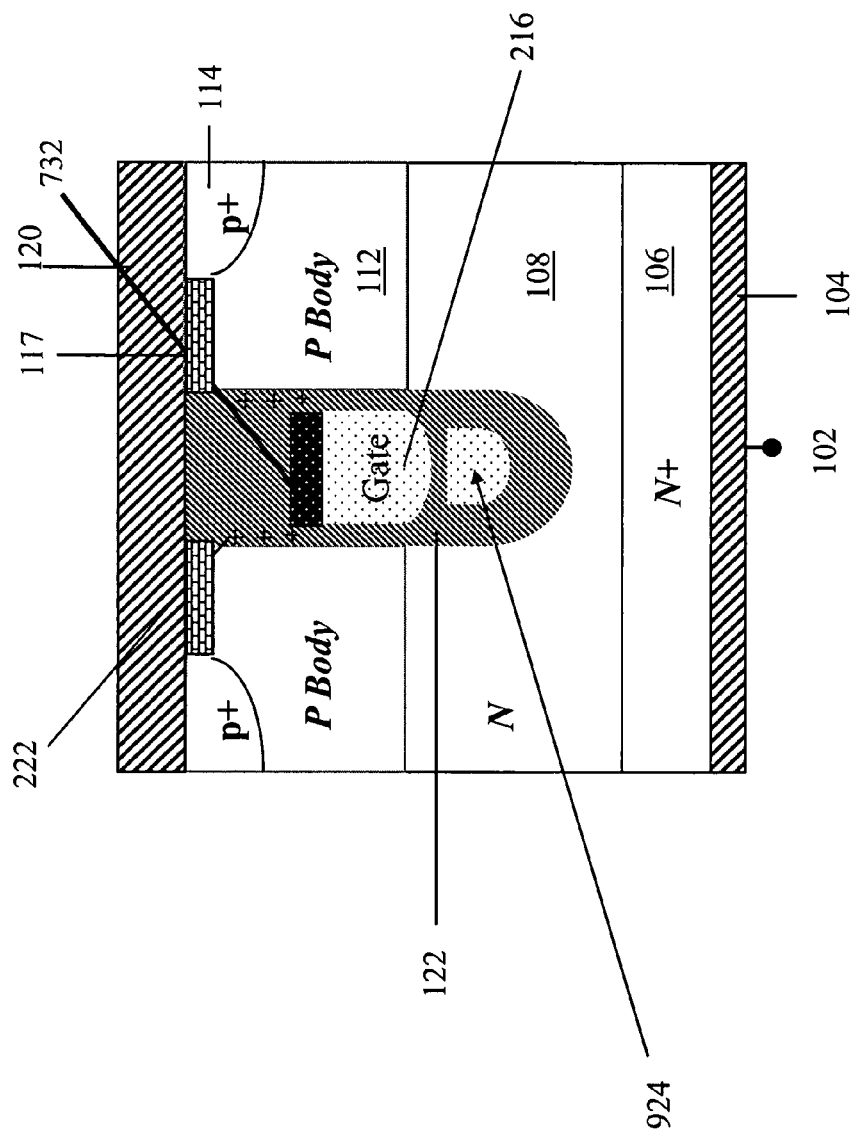
FIG. 9(e) is a cross-sectional view depicting a trench MOSFET having a gate-Schottky Barrier source offset, polysilicon shield layer connected to source and gate polycide gate material, in accordance with an embodiment.

FIG. 9(e) depicts a power MOSFET 905 in accordance with another device embodiment, which is generally quite similar to that of FIG. 9(b), except that a Schottky Barrier source 117 is used instead of n+ source 116. Other elements are generally similar to those of the preceding drawings, and are generally numbered the same.

Figure 9F:
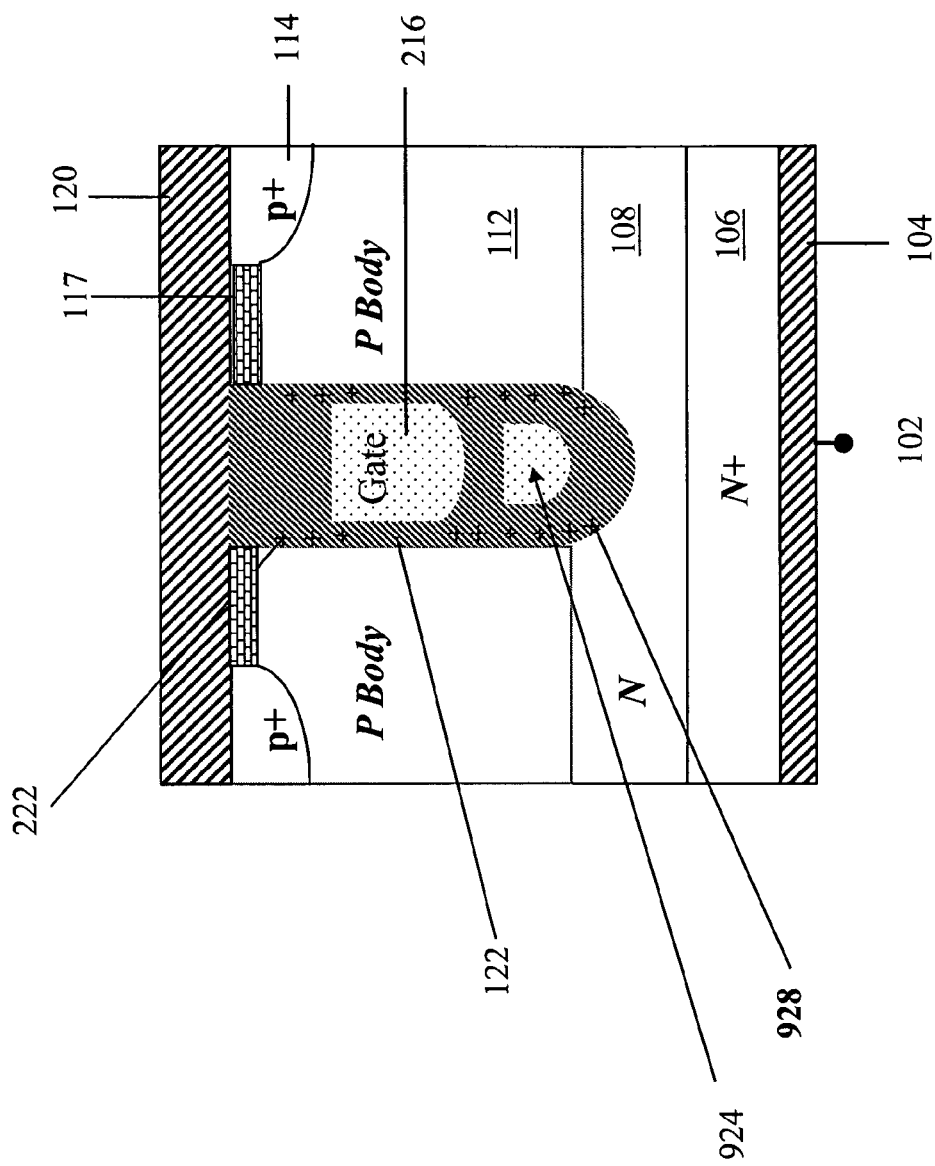
FIG. 9(f) is a cross-sectional view depicting a trench MOSFET having a gate-Schottky Barrier source offset, a polysilicon shield layer connected to the source and a gate p-body-drain junction offset, in accordance with an embodiment.

FIG. 9(f) depicts a power MOSFET 906 in accordance with another device embodiment, which is generally quite similar to that of FIG. 9(c), except that a Schottky Barrier source 117 is used instead of n+ source 116. Other elements are generally similar to those of the preceding drawings, and are generally numbered the same.

Figures 10A, 10B:
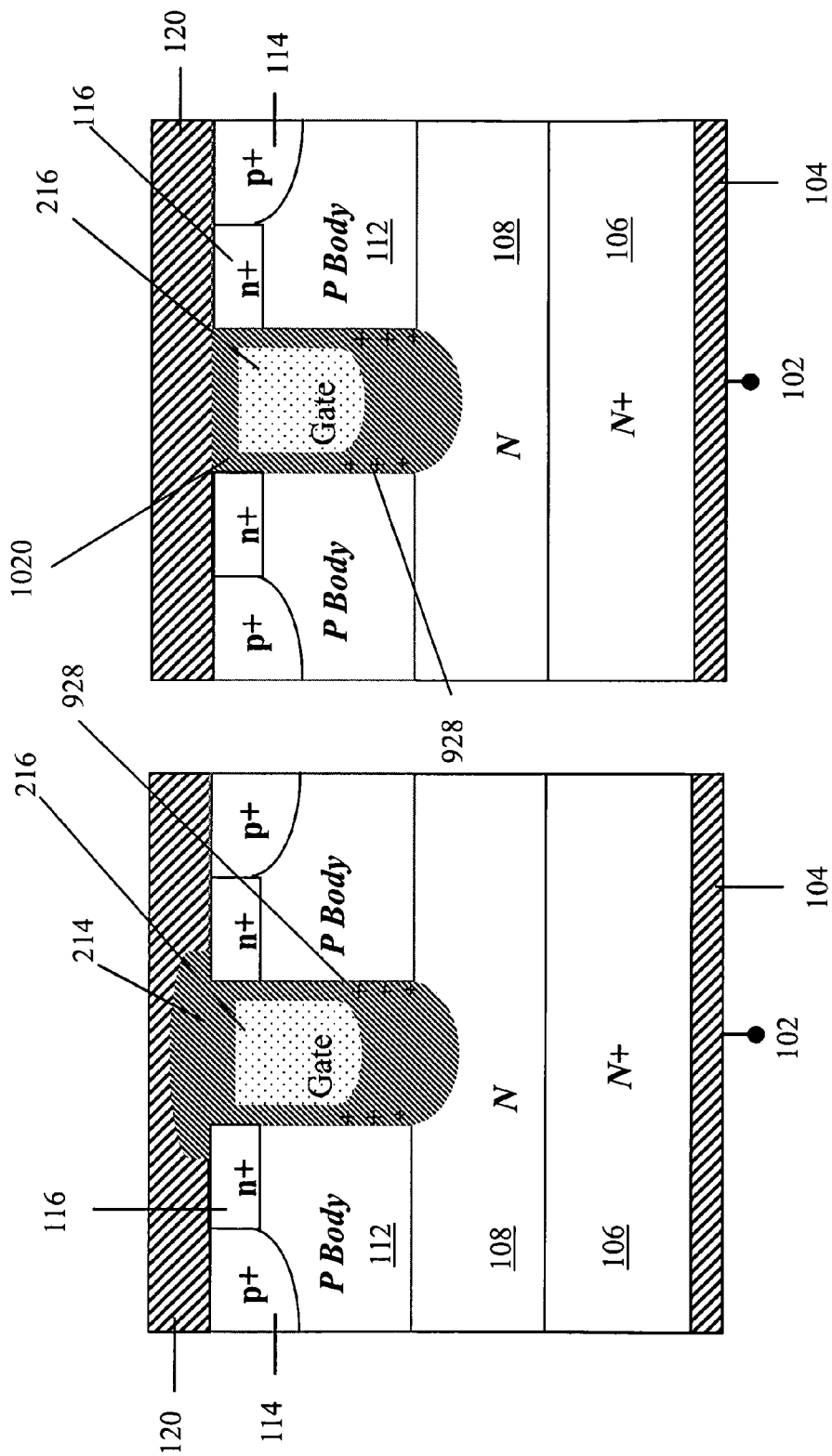
FIG. 10(a) is a cross-sectional view depicting a trench MOSFET having a gate-p-body-drain junction offset, in accordance with an embodiment.
FIG. 10(b) is a cross-sectional view depicting a trench MOSFET having a gate-p-body-drain junction offset, in accordance with an embodiment.

This is illustrated in FIG. 10(a), where MOSFET 1000 includes permanent charge 928 on the drain side, but not necessarily on the source side. In this example the permanent charges 928 can be positioned at a distance from the gate electrode 216, since the electric field from the gate electrode will invert portions of body 112 which are adjacent to it. Note again that a substantial vertical offset separates the gate 216 from the body/drain junction. In this example permanent charge 928 is positioned within the gate insulation layer 122. Other elements are generally similar to those of the preceding drawings, and are generally numbered the same.

FIG. 10(b) shows another device embodiment 1001, which is generally quite similar to that of FIG. 10(a), except that the dielectric over the gate electrode is planarized. Other elements are generally similar to those of the preceding drawings, and are generally numbered the same.

Figure 11:
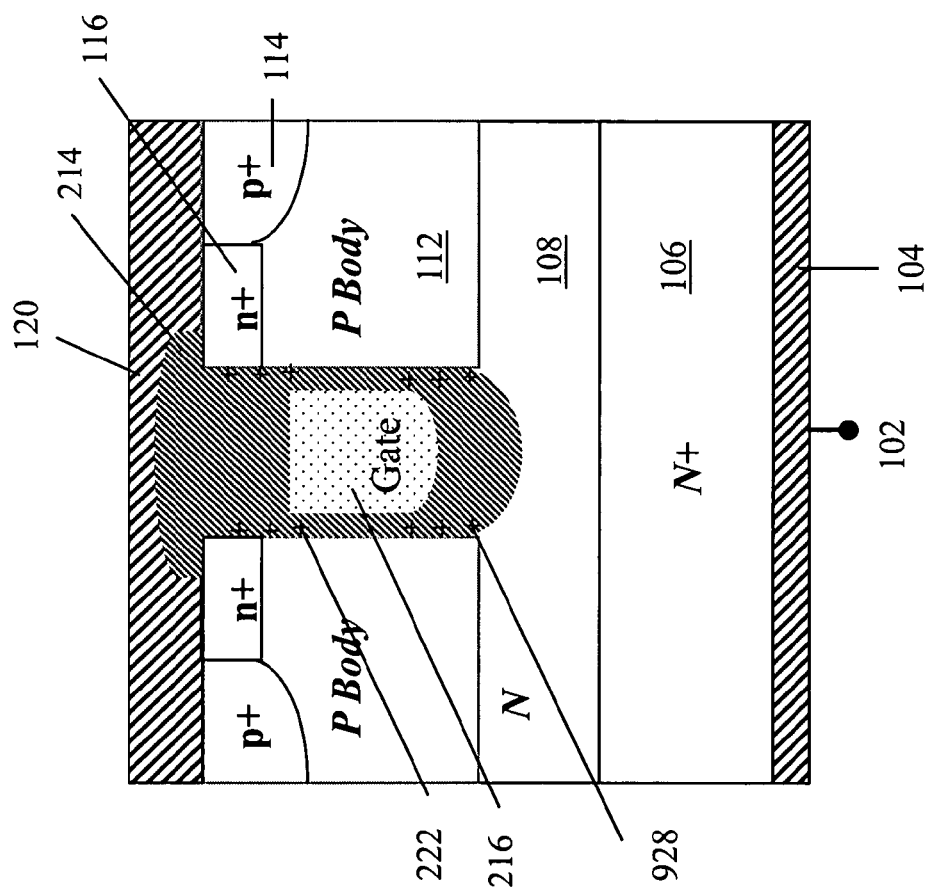
FIG. 11 is a cross-sectional view depicting a trench MOSFET having a gate-n+ source and gate-p-body-drain junction offset, in accordance with an embodiment.

FIG. 11 shows a single-gate device with both induced source extension (due to charge 222) and induced drain extension (due to charge 928). Other elements are generally similar to those of the preceding drawings, and are generally numbered the same.

FIG. 12(a) shows yet another alternative embodiment 1200, which is generally similar to device 1100, except that the "nailhead" portion of the dielectric over gate 216 has been replaced by a planar oxide surface. Other elements are generally similar to those of the preceding drawings, and are generally numbered the same.

FIG. 12(b) depicts a power MOSFET 1201 in accordance with another device embodiment, which is generally quite similar to that of FIG. 12(a), except that a Schottky Barrier source 117 is used instead of n+ source 116. Other elements are generally similar to those of the preceding drawings, and are generally numbered the same.

Figures 13, 14:
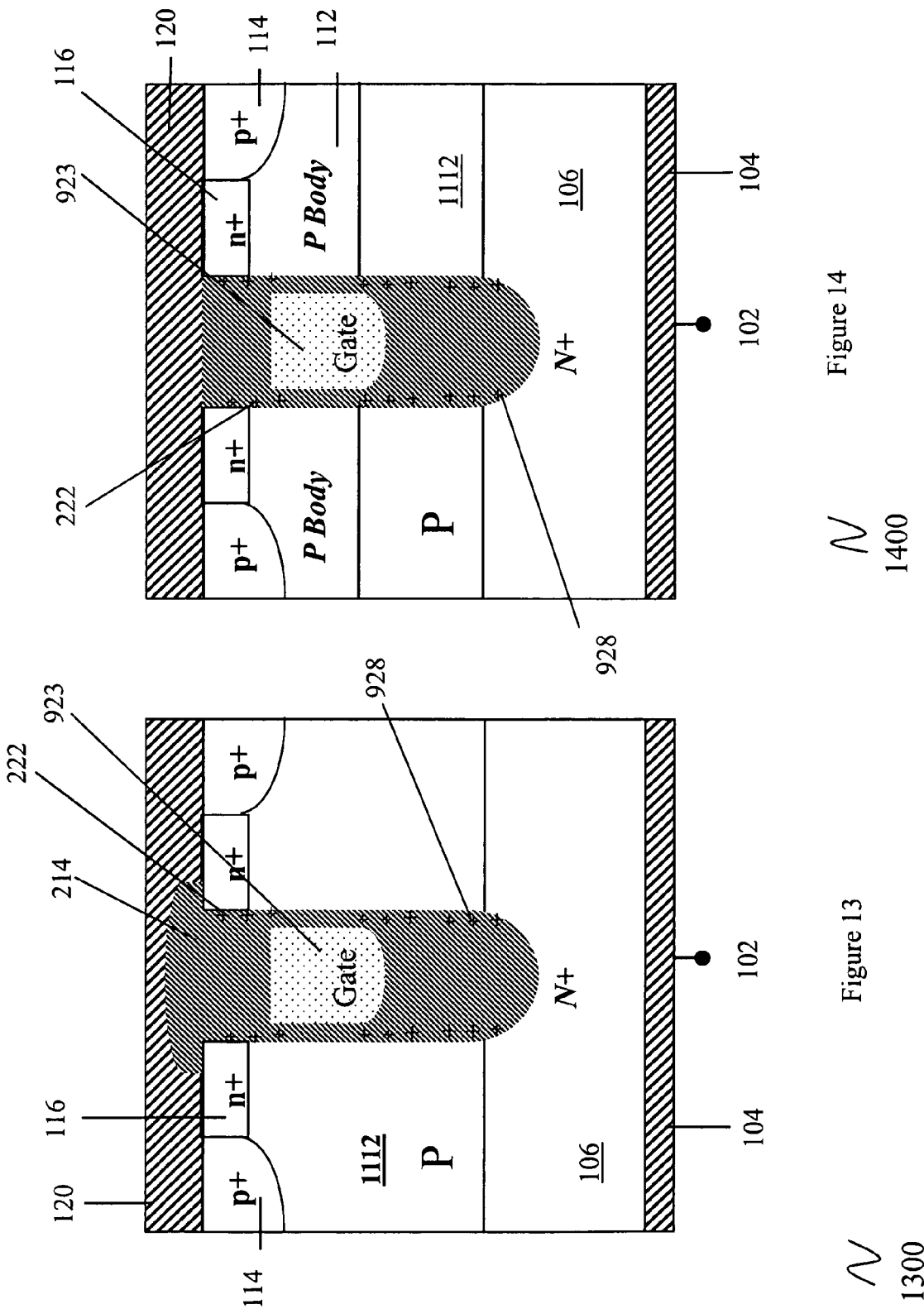
FIG. 13 is a cross-sectional view depicting a trench MOSFET having a gate-n+ source and gate/p-body-drain junction offsets, in accordance with an embodiment.
FIG. 14 is a cross-sectional view depicting a trench MOSFET having a gate-n+ source and gate/p-body-drain junction offsets, in accordance with an embodiment.

FIG. 13 shows an embodiment 1300 in which the gate trench is extended downward all the way into the deep drain 106. The p-type layer 1112, which can be formed by an epitaxial layer or a p-type diffused layer, provides appropriate doping for channel control. Here too the permanent charge 928 allows vertical offset between the gate electrode and the body/drain junction.

FIG. 14 shows yet another alternative embodiment 1400, which is generally similar to device 1300, except that the "nailhead" portion of the dielectric over gate 216 has been replaced by a planar oxide surface. Also, this embodiment does have additional doping to provide a body region 112 within the p-type layer 1112. The charge in this case can also be along all the side wall. Other elements are generally similar to those of the preceding drawings, and are generally numbered the same.

Figure 15:
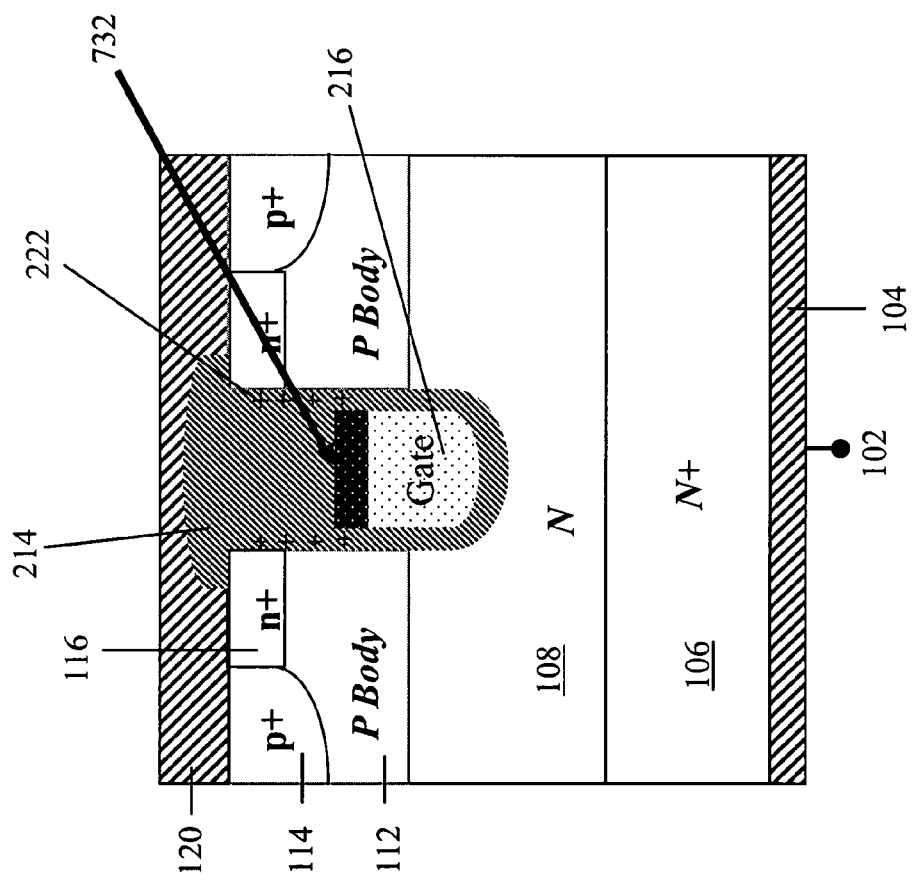
FIG. 15 is a cross-sectional view depicting a trench MOSFET having a polycide gate, in accordance with an embodiment.

FIG. 15 shows a cross-sectional view depicts an n-channel MOSFET 1500 in accordance with another embodiment. In this embodiment, silicide cladding 732 has been added to the gate electrode 216. Other elements are generally similar to those of the preceding drawings, and are generally numbered the same.

Figure 16A:
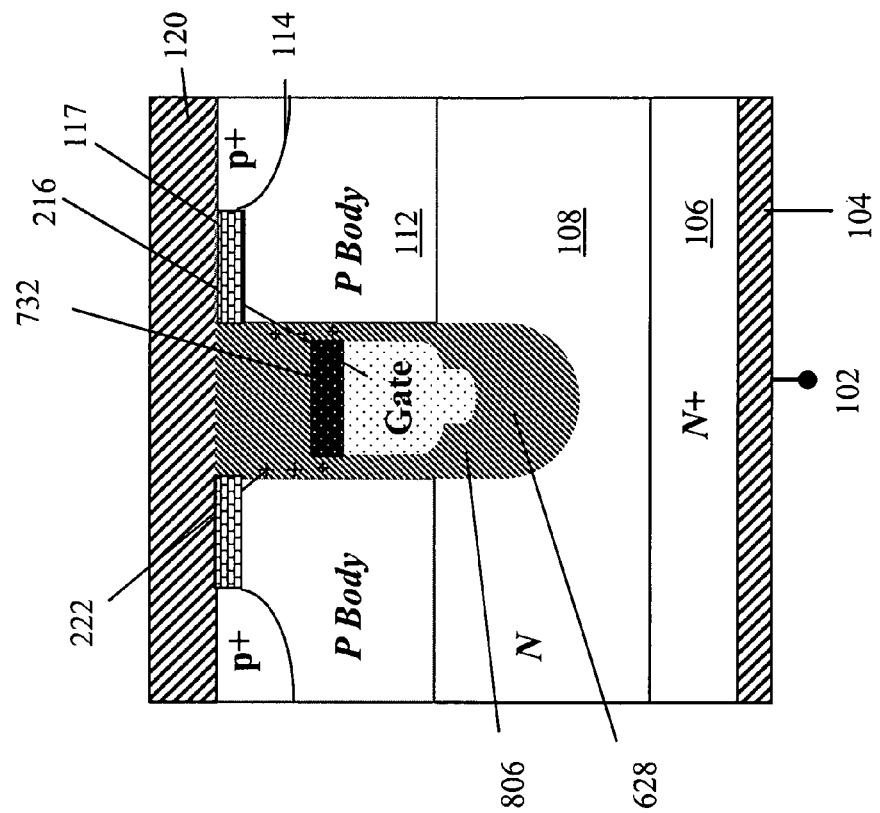
FIGS. 16(a) and 16(b) are cross-sectional views depicting a trench MOSFET having a smooth gate-oxide thick-bottom transition region and a polycide gate, in accordance with an embodiment.

FIG. 16(a) shows another device structure in which silicide cladding 732 has been added to the gate electrode 216. In this case the gate electrode has a shape like that of the embodiment shown in FIG. 8(a). Other elements are generally similar to those of the preceding drawings, and are generally numbered the same.

Figure 16B:
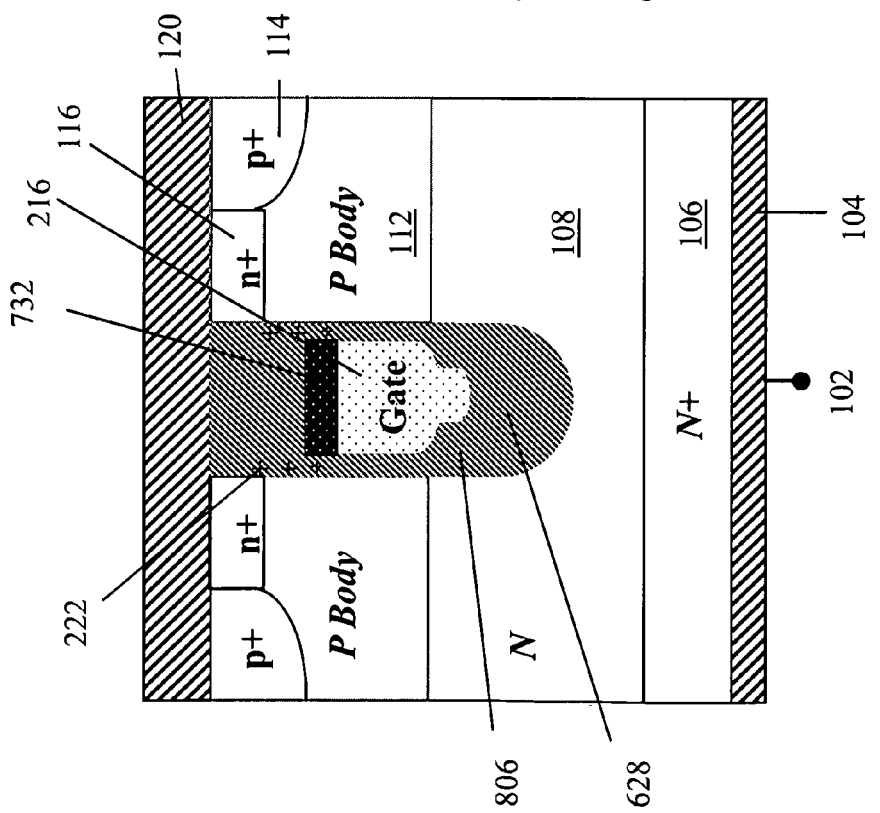

FIG. 16(b) depicts a power MOSFET 1601 in accordance with another device embodiment, which is generally quite similar to that of FIG. 16(a), except that a Schottky Barrier source 117 is used instead of n+ source 116. Other elements are generally similar to those of the preceding drawings, and are generally numbered the same.

Figure 17:
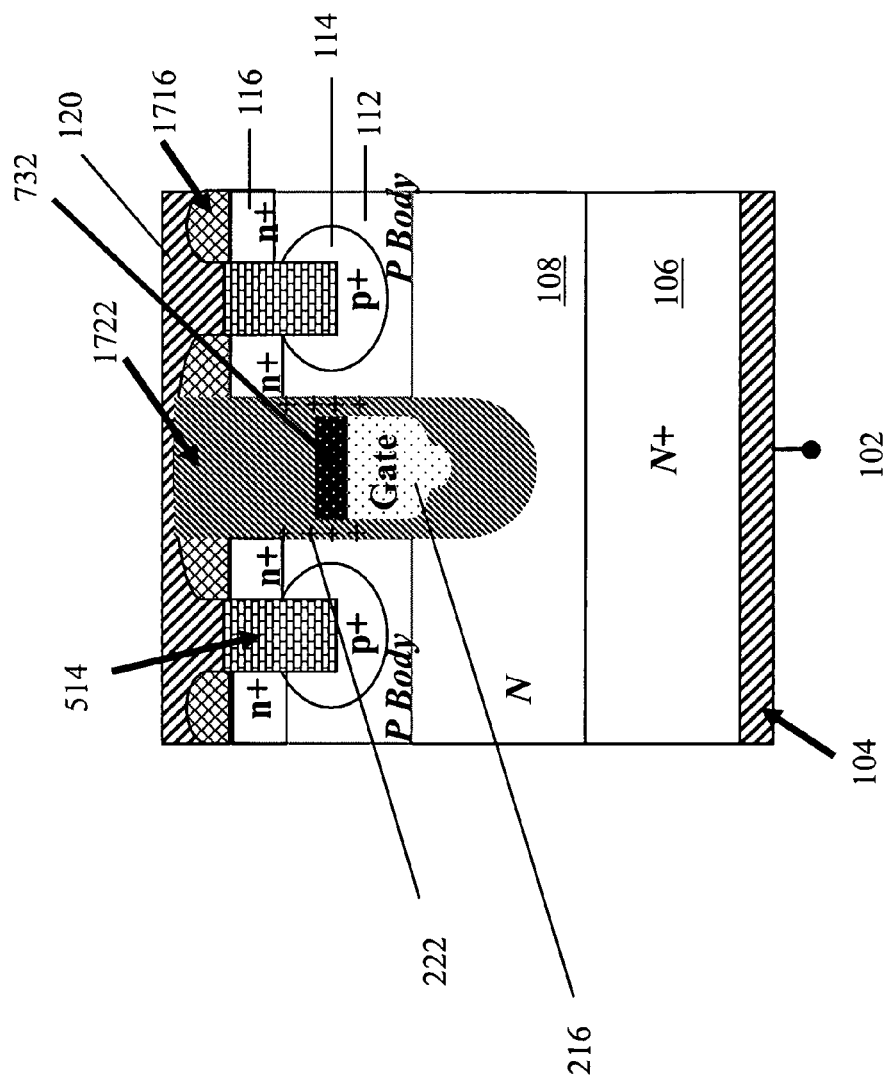
FIG. 17 is a cross-sectional view depicting a trench MOSFET having self-aligned trench contacts, silicided gate and thick bottom oxide, in accordance with an embodiment.

FIG. 17 shows another embodiment 1700, which combines elements shown in FIGS. 2, 5, 8, and 16. Note that this embodiment also shows sidewall spacers 1716 which define the spacing between the gate trench and the body contact 514. By allowing the dielectric 1722 above the gate 216 to reach above the semiconductor surface, sidewall spacers 1716 are self-aligned to the gate trench. If these sidewall spacers are used as hardmasks for etching the body contact trench, the body contact diffusion 114 is self-aligned to the gate trench, producing a very compact structure. Other elements are generally similar to those of the preceding drawings, and are generally numbered the same.

Figure 18:
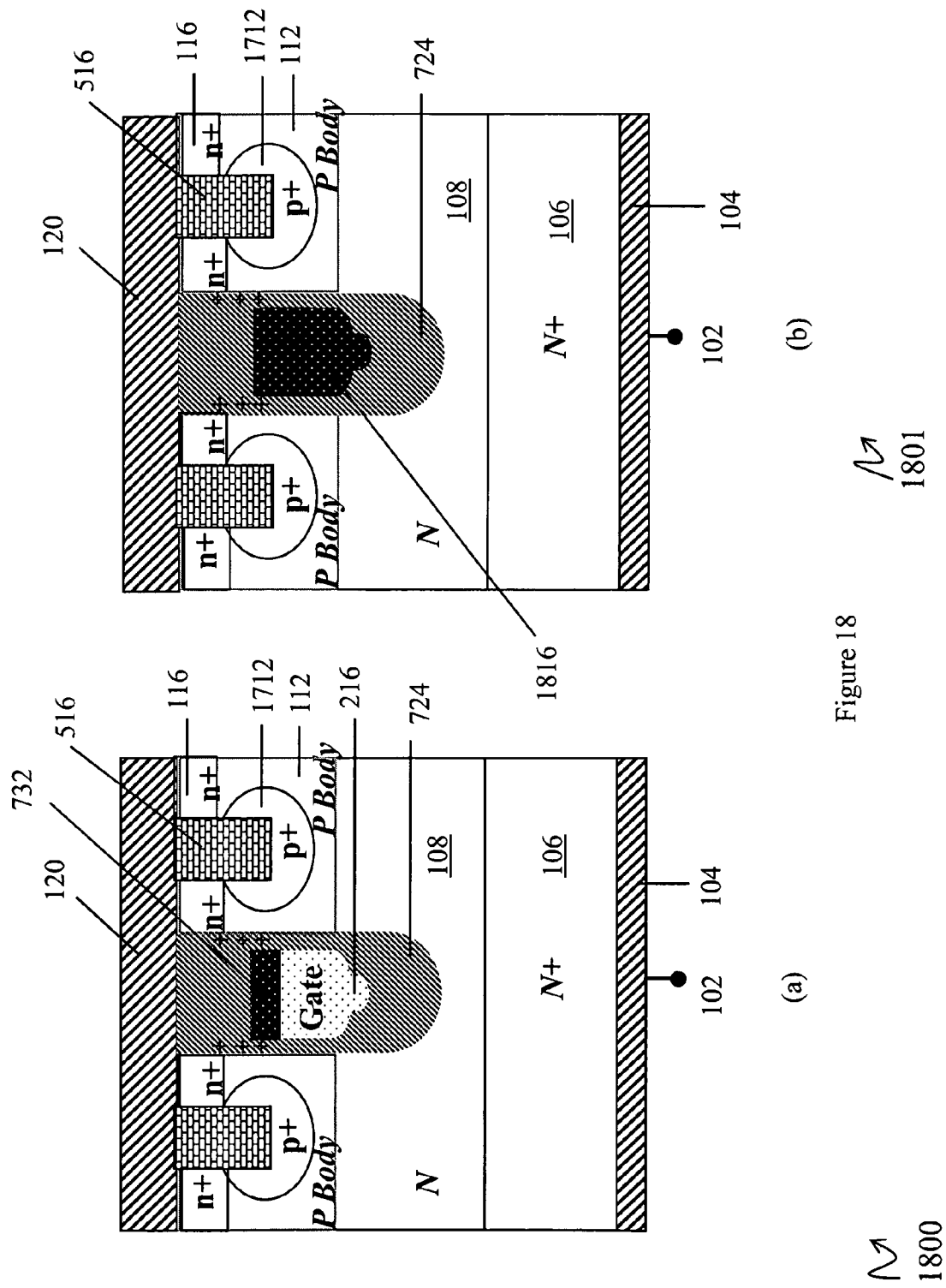
FIGS. 18(a), (b), (c) and (d) are cross-sectional views depicting a trench MOSFET having thick bottom oxide and silicided gates, in accordance with an embodiment.
Figure 18:
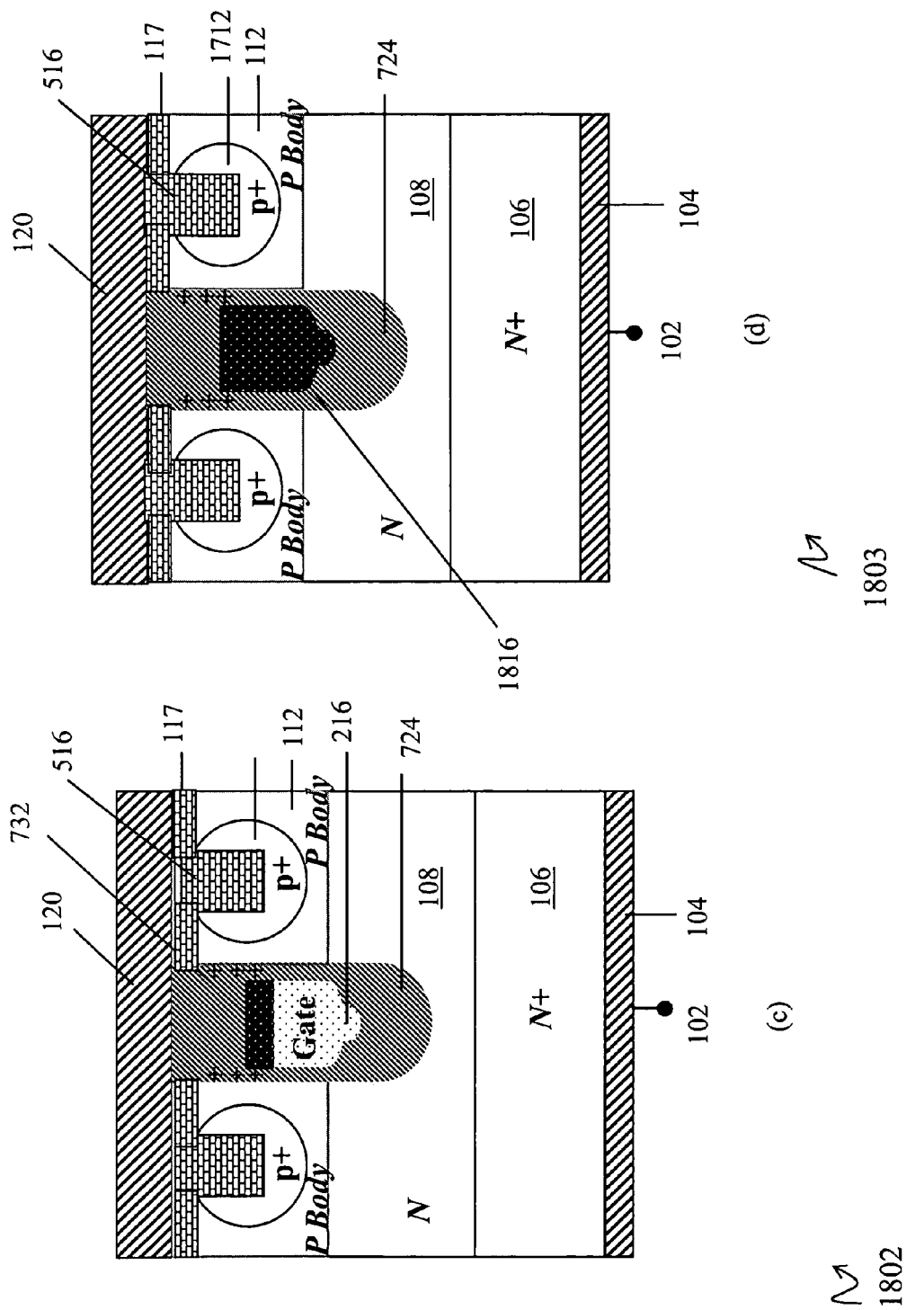

FIG. 18(a) shows a variation of FIG. 17, in which the dielectric has been planarized, so that protrusion 1722 and sidewall spacers 1716 are absent. Other elements are generally similar to those of the preceding drawings, and are generally numbered the same.

FIG. 18(b) shows another alternative embodiment 1801, in which the gate electrode 1816 has been fully reacted to silicide. Other elements are generally similar to those of the preceding drawings, and are generally numbered the same.

FIG. 18(c) depicts a power MOSFET 1802 in accordance with another device embodiment, which is generally quite similar to that of FIG. 18(a), except that a Schottky Barrier source 117 is used instead of n+ source 116. Other elements are generally similar to those of the preceding drawings, and are generally numbered the same.

FIG. 18(d) depicts a power MOSFET 1803 in accordance with another device embodiment, which is generally quite similar to that of FIG. 18(b), except that a Schottky Barrier source 117 is used instead of n+ source 116. Other elements are generally similar to those of the preceding drawings, and are generally numbered the same.

Figure 19:
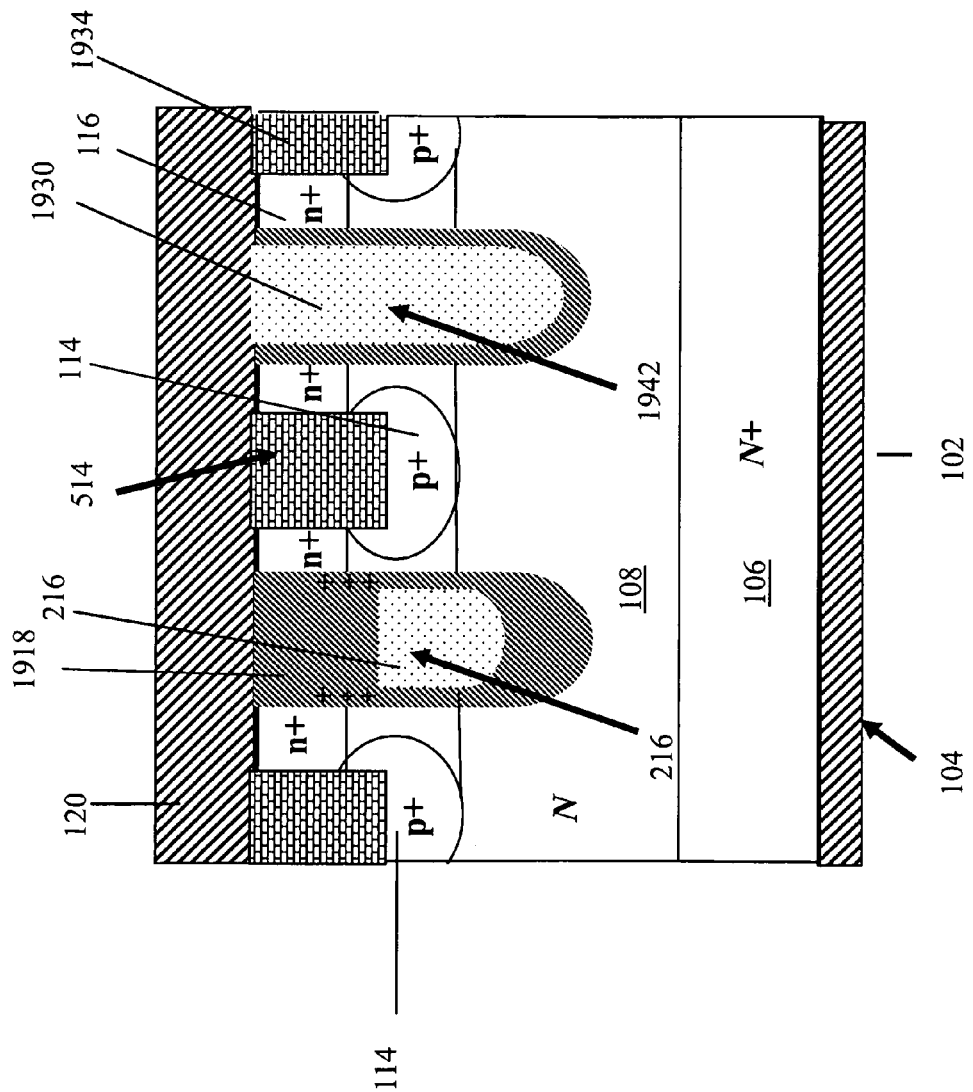
FIG. 19 is a cross-sectional view depicting a trench MOSFET having gate-n+ source offset and a recessed field plate, in accordance with an embodiment.

FIG. 19 shows a significantly different embodiment, in which the gate trenches are flanked by Recessed Field Plate (RFP). In this example the MOSFET 1900 includes a recessed field plate (RFP) trench 1942 filled with conducting material such as polysilicon 1930. This conductor is preferably connected to the source. This can be done in the plane of the drawing shown, or alternatively can be done elsewhere along the length of the RFP trench (which in this example is perpendicular to the plane of the paper). Operation of the active device, including the induced source and/or drain extensions, is otherwise as described in the other embodiments above.

Figure 20:
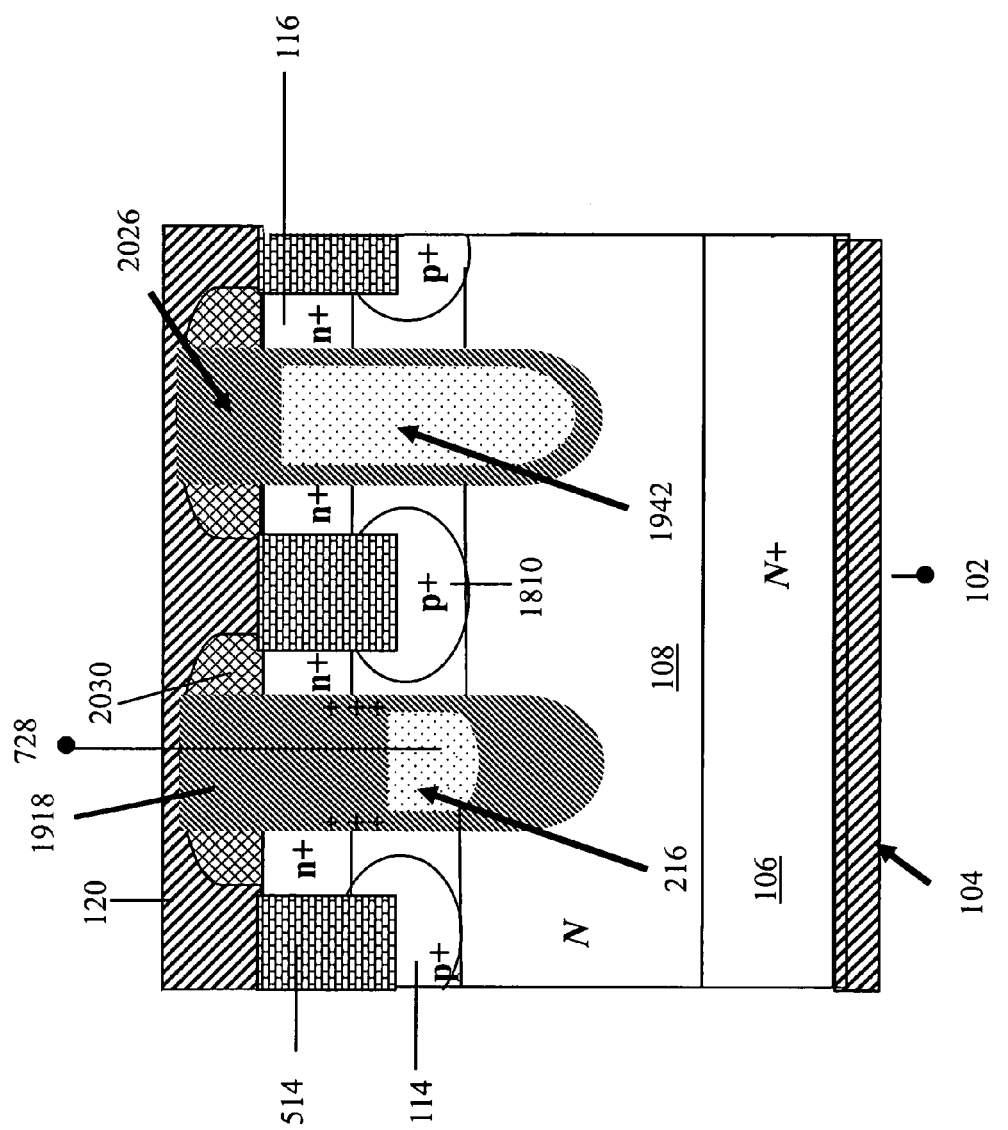
FIG. 20 is a cross-sectional view depicting a trench MOSFET having a gate-n+ source offset, recessed field plate and self-aligned trench contacts, in accordance with an embodiment.

FIG. 20 depicts a power MOSFET 2000 with RFP structures and self-alignment of the body contact trench. The MOSFET 2000 may have a recessed field plate (RFP) trench 2026 filled with conducting material such as polysilicon

1942, which is connected to the source (not shown). The power MOSFET 2000 may have a self-aligned trench contact 514, which is separated from the gate 216 and the RFP 2026 by the dielectric layer 2030.

Figure 21:
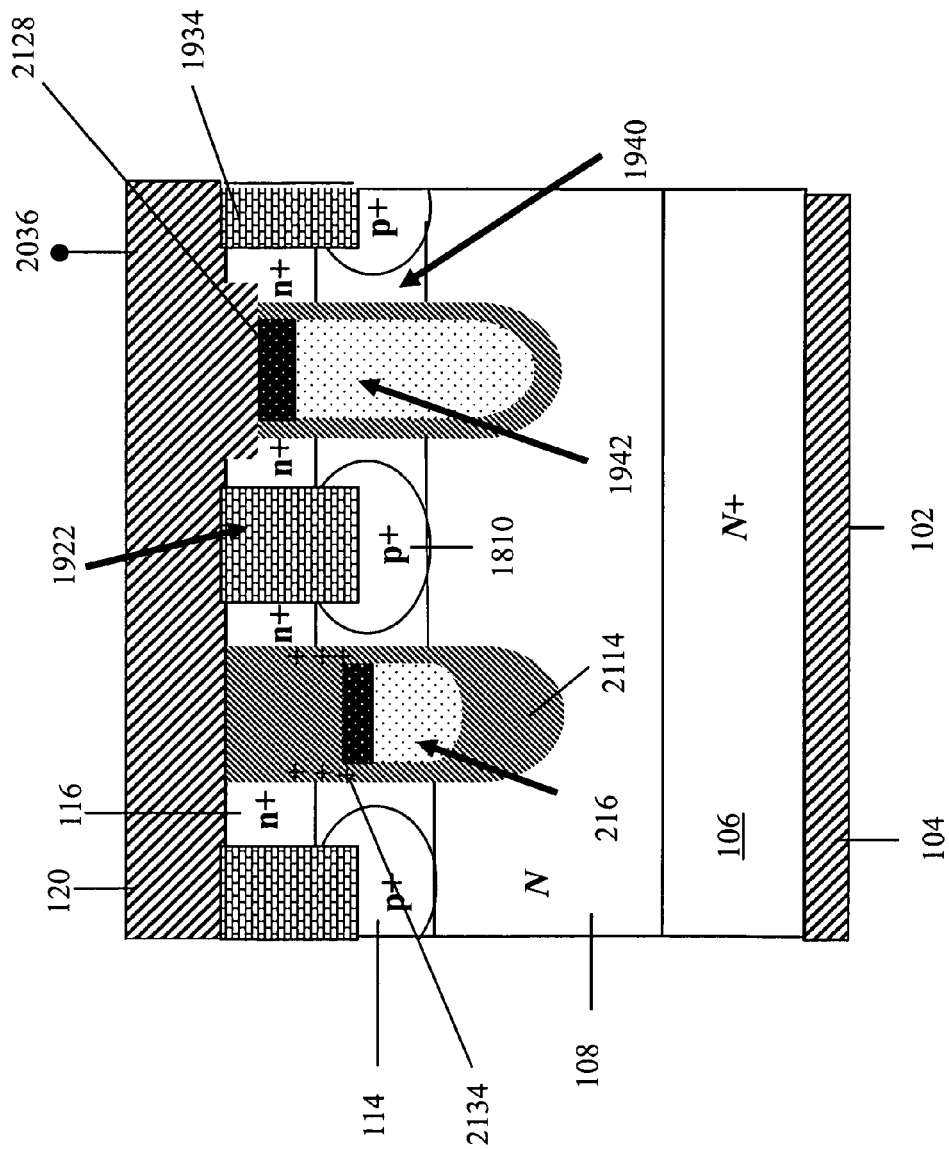
FIG. 21(a) is a cross-sectional view depicting a trench MOSFET having a partially silicided gate and a recessed field plate, in accordance with an embodiment.
FIG. 21(b) is a cross-sectional view depicting a trench MOSFET having gate-n+ source offset, fully silicided gate and partially silicided recessed field plate, in accordance with an embodiment.
FIG. 21(c) is a cross-sectional view depicting a trench MOSFET having gate-Schottky Barrier source offset, a partially silicided gate and a recessed field plate, in accordance with an embodiment.
Figure 21B:
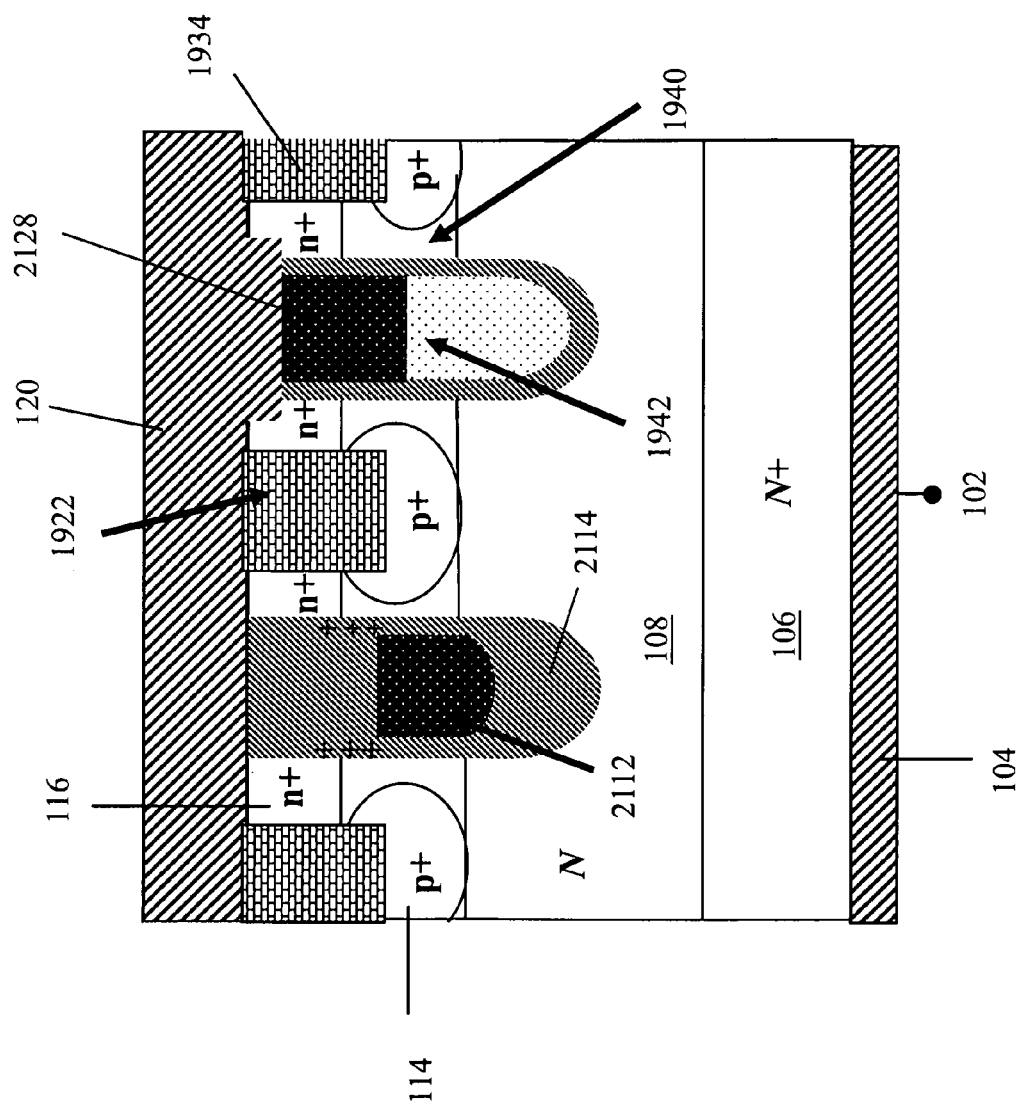
Figure 21:
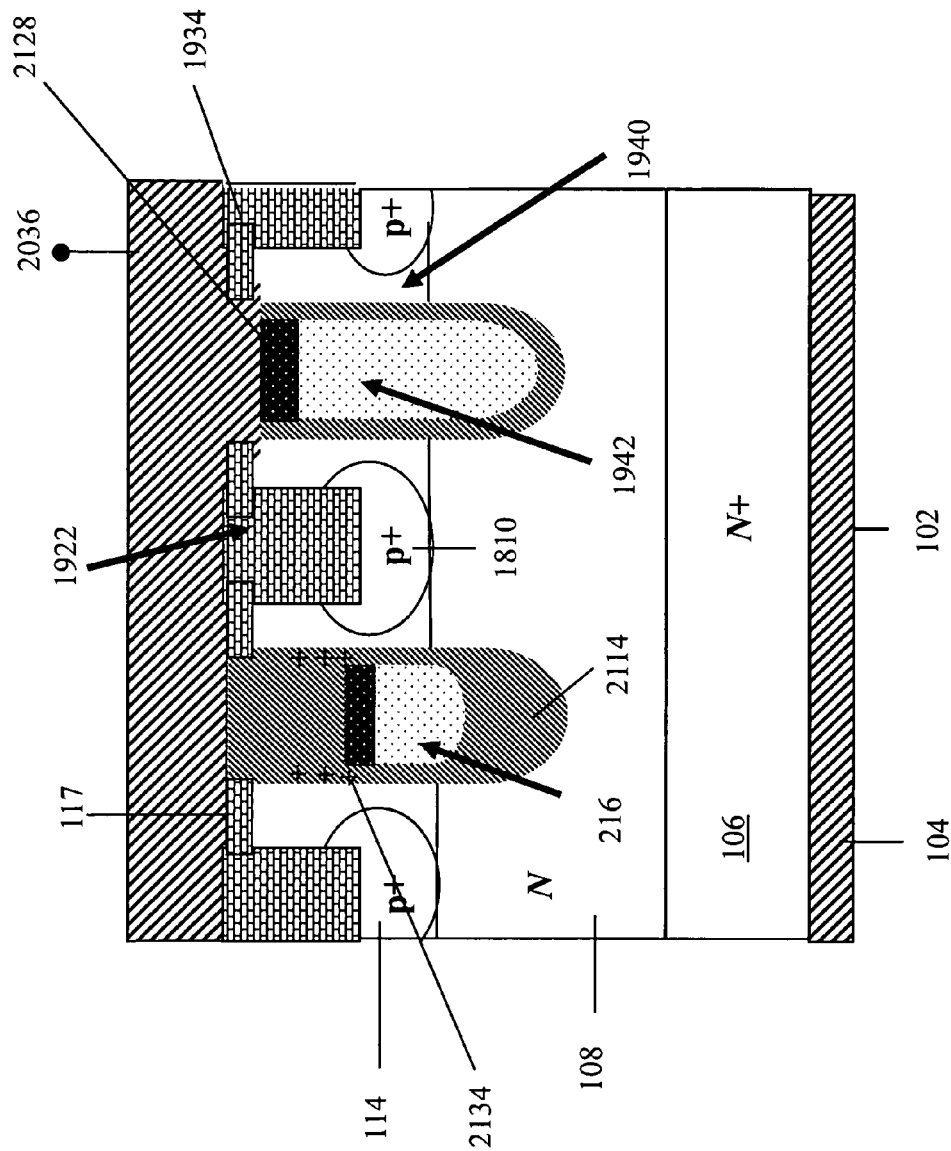

With reference to FIG. 21(*a*), a cross-sectional view depicts power MOSFET 2100 in accordance with embodiments. MOSFET 2100 may be characterized as having a drain lead 102 on a backside contact 104. A heavily doped drain region 106 adjoins a backside contact 104. A drain 106 is separated from a source 116 by a body 1940. A gate insulation layer 2114 is formed in a trench containing a gate 216. Gate insulation layer 2114 may extend to a source and body metallization 120. Body contact regions 1810 are adjacent to the body 1940. The power MOSFET 2100 includes a gate-source offset and a thickened gate bottom dielectric 2114 such as oxide. The power MOSFET 2100 includes a trench contact 1922. The trench contact 1934 may be filled with a conducting material such as tungsten or a silicide. The MOSFET 2100 may have a recessed field plate (RFP) trench 1942 filled with conducting material such as polysilicon. The RFP 1942 is connected to the source 116. The power MOSFET 2100 may have a self-aligned trench contact 1922. The MOSFET 2100 may have a polycided gate 216 and an RFP electrode 2128. Source and body metallization 120 contact source and body lead 2036. Permanent charge 2134 induces an inversion layer which allows electron flow when the leads are properly biased.

With reference to FIG. 21(*b*), a cross-sectional view depicts power MOSFET 2101 in accordance with embodiments. MOSFET 2101 may be characterized as having a drain lead 102 on a backside contact 104. A heavily doped drain region 106 adjoins a backside contact 104. A drain 106 is separated from a source 116 by a body 1940. A gate insulation layer 2114 is formed in a trench containing a gate 216. Gate insulation layer 2114 may extend into a source and body metallization 120. Body contact regions 114 are adjacent to the body 1940. The power MOSFET 2101 includes a gate-source offset and a thickened gate bottom dielectric 2114 such as oxide. Permanent charge is introduced into the gate insulation layer 2114 between the bottom of the source region 116 and the top of the gate 2112 to induce an inversion layer that allows electron flow when the leads are properly biased. The power MOSFET 2101 includes a trench contact 1922. The trench contact 1922 may be filled with a conducting material such as tungsten or a silicide. The MOSFET 2101 may have a recessed field plate (RFP) trench 1942 filled with conducting material such as polysilicon. The power MOSFET 2101 may have a self-aligned trench contact 1934. The MOSFET 2101 may have a polycided gate 2112 and an RFP electrode 2128.

FIG. 21(*c*) depicts a power MOSFET 2102 in accordance with another device embodiment, which is generally quite similar to that of FIG. 21(*a*), except that a Schottky Barrier source 117 is used instead of n+ source 116. Other elements are generally similar to those of the preceding drawings, and are generally numbered the same.

Figures 22C, 22D:
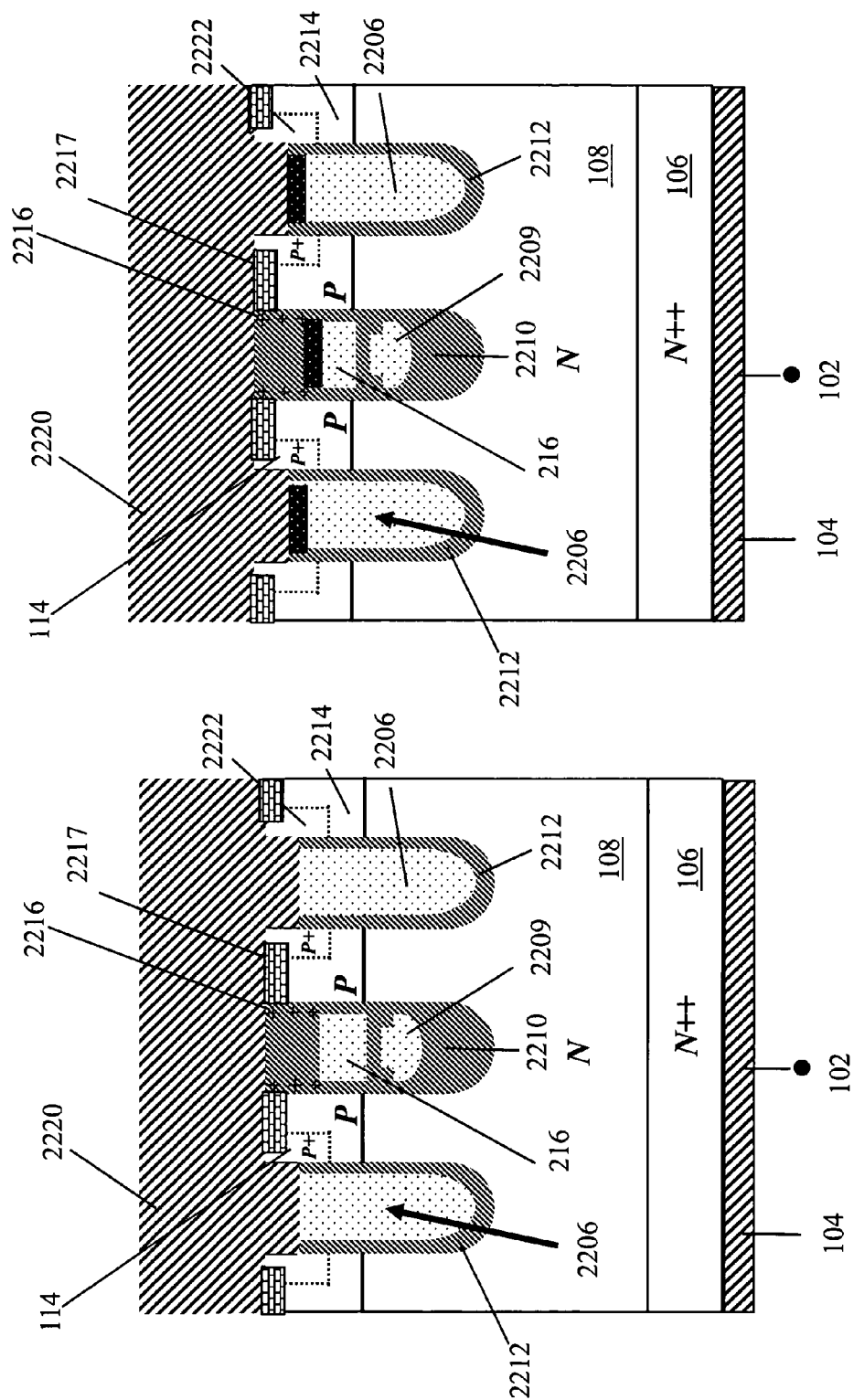
FIG. 22(c) is a cross-sectional view depicting a trench MOSFET having gate-Schottky Barrier source offset, recessed field plates and a polysilicon shield layer connected to the source, in accordance with an embodiment.
FIG. 22(d) is a cross-sectional view depicting a trench MOSFET having gate-Schottky Barrier source offset, recessed field plates, a polysilicon shield layer connected to the source and double polycide layers, in accordance with an embodiment.
Figure 23B:
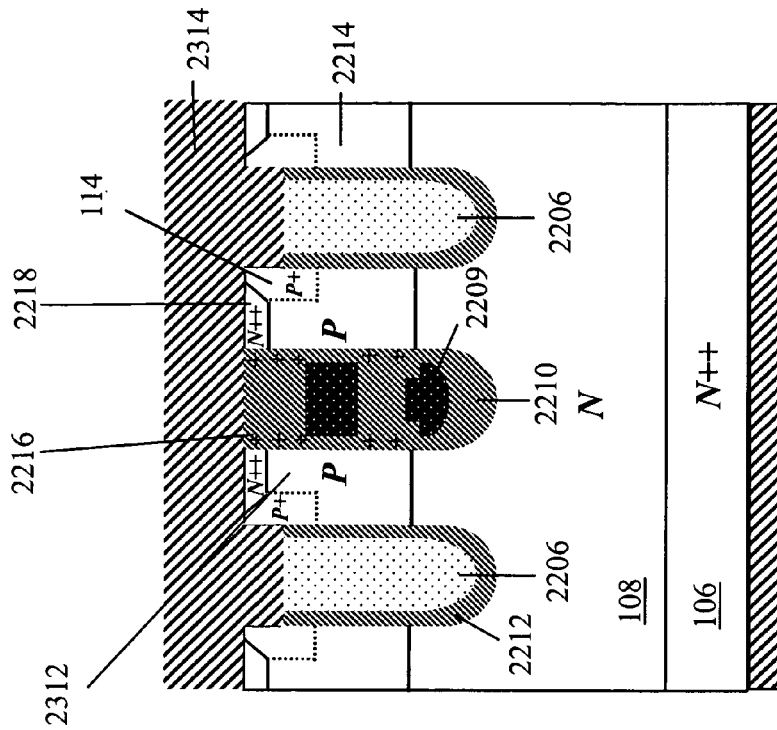
FIG. 23(b) is a cross-sectional view depicting a trench MOSFET having recessed field plates and double polycide layers, in accordance with an embodiment.
Figure 23A:
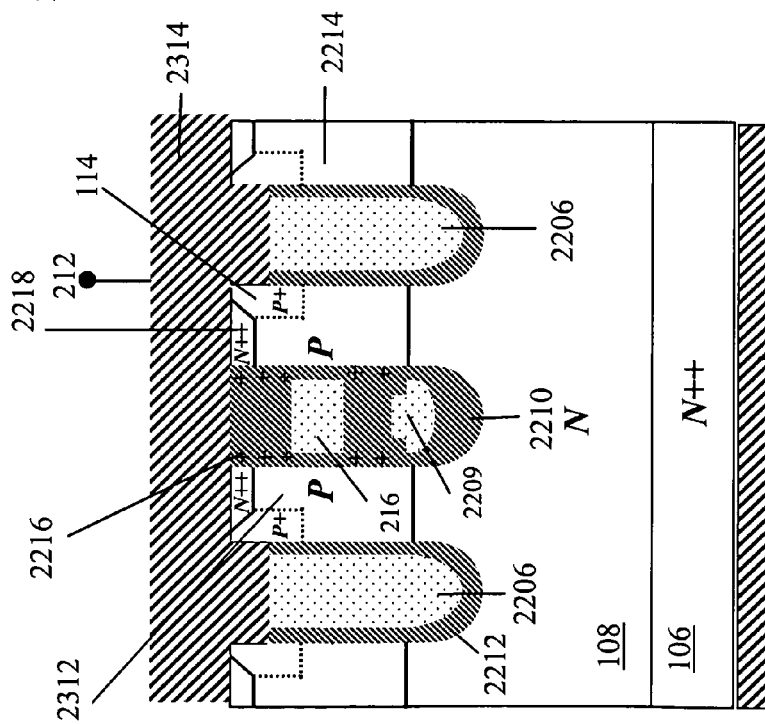
FIG. 23(a) is a cross-sectional view depicting a trench MOSFET having a gate-n+ source and gate/p-body-drain junction offsets, recessed field plates and a polysilicon shield layer connected to the source, in accordance with an embodiment.
Figure 23D:
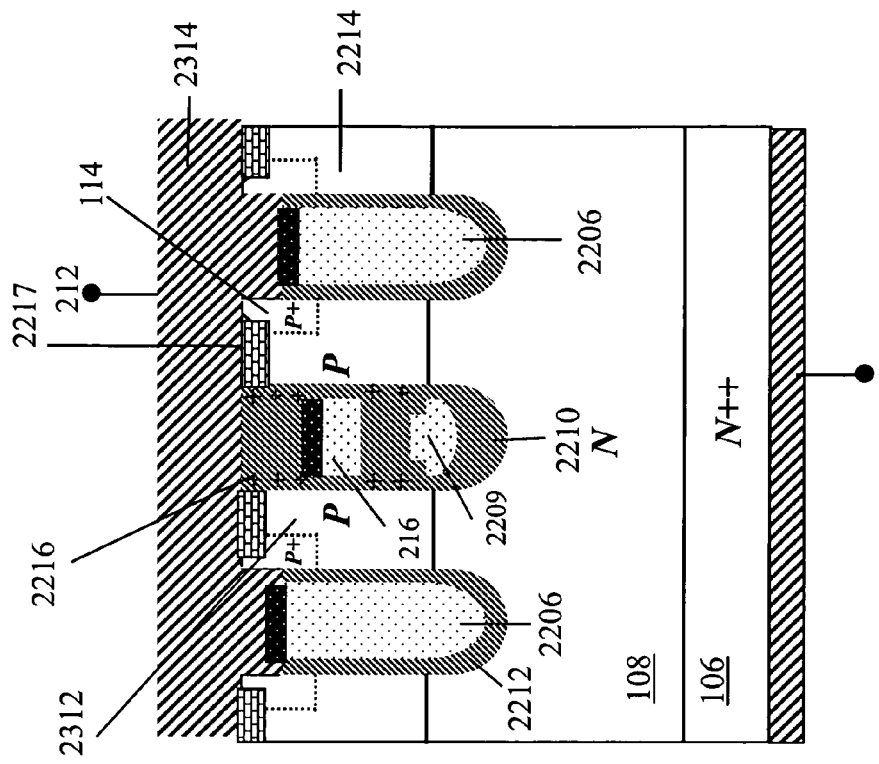
FIG. 23(d) is a cross-sectional view depicting a trench MOSFET having a gate-Schottky Barrier source and gate/p-body-drain junction offsets, recessed field plates, a polysilicon shield layer connected to the source and double polycide layers, in accordance with an embodiment.
Figure 23C:
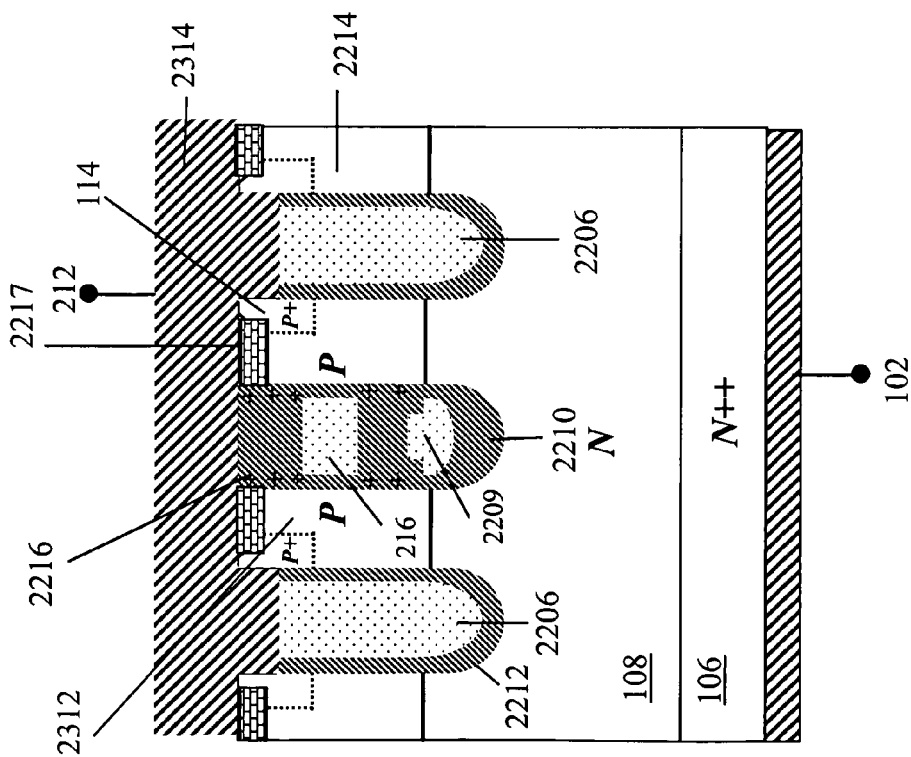
FIG. 23(c) is a cross-sectional view depicting a trench MOSFET having a gate-Schottky Barrier source and gate/p-body-drain junction offsets, recessed field plates and a polysilicon shield layer connected to the source, in accordance with an embodiment.

With reference to FIG. 22(*a*), a cross-sectional view depicts a power MOSFET 2200 in accordance with an embodiment. A heavily doped drain region 106 contacts a drain 104. Drain 108 is separated from a source 2218 by a body 2214. A gate insulation layer 2212 is formed in a trench containing a gate 216. Gate insulation layer 2210 may extend to a source and body metallization 120. Body contact regions 114 are adjacent to the body 2214. The power MOSFET 2200 includes a gate-source offset and a thickened gate bottom dielectric 2210 such as oxide. The MOSFET 2200 may have a recessed field plate (RFP) trench 2212 filled with conducting material such as polysilicon 2206. An embedded permanent charge 2216 may be provided within a gate insulation layer 2210, approaching the junction between the gate insulation layer 2210, the body 2214, and the source 2218. The permanent charges 2216 may typically be positioned at a distance from the gate electrode 216. This embodiment has a split gate structure, in which the bottom poly 2209 is preferably tied to the source voltage. This provides improved protection of the channel area from excessive electric fields during the off state, particularly when transients occur and results in a lower gate-drain capacitance Cgd.

With reference to FIG. 22(*b*), a cross-sectional view depicts a power MOSFET 2201 in accordance with an embodiment. A heavily doped drain region 106 contacts a drain 104. Drain 106 is separated from a source 2218 by a body 2214. A gate insulation layer 2210 is formed in a trench containing a gate 216. Gate insulation layer 2110 may extend into a source and body metallization 120. Body contact regions 114 are adjacent to the body 2214. The power MOSFET 2201 includes a gate-source offset and a thickened gate bottom dielectric 2210 such as oxide. The MOSFET 2201 may have a recessed field plate (RFP) trench 2212 filled with conducting material such as polysilicon 2206. An embedded permanent charge 2216 may be provided within a gate insulation layer 2210, approaching the junction between the gate insulation layer 2210, the body 2214, and the source 2218. The permanent charges 2216 may typically be positioned at a distance from the gate electrode 216. The MOSFET 2201 may include double polycide layers 2209.

FIG. 22(*c*) depicts a power MOSFET 2202 in accordance with another device embodiment, which is generally quite similar to that of FIG. 22(*a*), except that a Schottky Barrier source 2217 is used instead of n+ source 2218. Other elements are generally similar to those of the preceding drawings, and are generally numbered the same.

FIG. 22(*d*) depicts a power MOSFET 2203 in accordance with another device embodiment, which is generally quite similar to that of FIG. 22(*c*), except that MOSFET 2203 has a polycided gate and an RFP electrode. Other elements are generally similar to those of the preceding drawings, and are generally numbered the same.

With reference to FIG. 23(*a*), a cross-sectional view depicts a power MOSFET 2300 in accordance with embodiments. A heavily doped drain region 106 contacts a drain 104. Drain 106 is separated from a source 2218 by a body 2214. A gate insulation layer 2210 is formed in a trench containing a gate 216. Gate insulation layer 2210 may extend into a source and body metallization 120. Body contact regions 114 are adjacent to the body 2214. The power MOSFET 2300 includes a gate-source offset and a thickened gate bottom dielectric 2210 such as oxide. The MOSFET 2300 may have a recessed field plate (RFP) trench 2226 filled with conducting material such as polysilicon. An embedded permanent charge 2216 may be provided within a gate insulation layer 2210, approaching the junction between the gate insulation layer 2210, the body 2214, and the source 2218. The permanent charges 2216 may typically be positioned at a distance from the gate electrode 216. The power MOSFET 2300 may have an approximately planar surface dielectric layer 2210.

With reference to FIG. 23(*b*), a cross-sectional view depicts a power MOSFET 2301 in accordance with embodiments. A heavily doped drain region 106 contacts a drain 104. Drain 104 is separated from a source 2218 by a body 2214. A gate insulation layer 2210 is formed in a trench containing a gate 216. Gate insulation layer 2210 may extend into a source and body metallization 120. Body contact regions 114 are adjacent to the body 2214. The power MOSFET 2301 includes a gate-source offset and a thickened gate bottom dielectric 2210 such as oxide. The MOSFET 2301 may have a recessed field plate (RFP) trench 2226 filled with conducting material such as polysilicon. An embedded permanent charge 2216 may be provided within a gate insulation layer 2210, approaching the junction between the gate insulation layer 2210, the body 2214, and the source 2218. The permanent charges 2216 may typically be positioned at a distance from the gate electrode 216. The power MOSFET 2301 may have an approximately planar surface dielectric layer 2210. The MOSFET 2301 may include double polycide layers 2209.

FIG. 23(*c*) depicts a power MOSFET 2302 in accordance with another device embodiment, which is generally quite similar to that of FIG. 23(*a*), except that a Schottky Barrier source 2217 is used instead of n+ source 2218. Other elements are generally similar to those of the preceding drawings, and are generally numbered the same.

FIG. 23(*d*) depicts a power MOSFET 2303 in accordance with another device embodiment, which is generally quite similar to that of FIG. 23(*c*), except that MOSFET 2303 has a polycided gate and an RFP electrode. Other elements are generally similar to those of the preceding drawings, and are generally numbered the same.

Figure 24B:
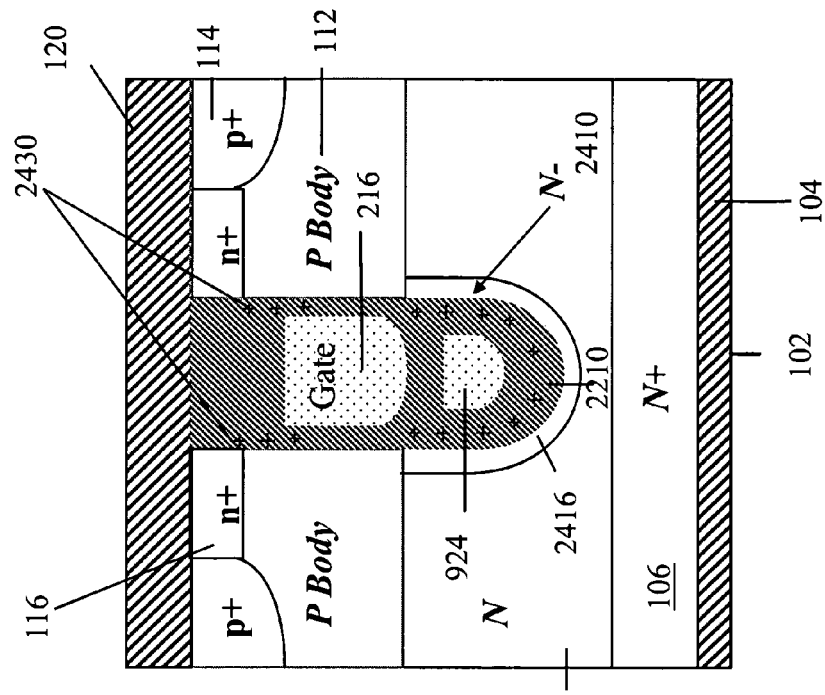
FIG. 24(b) is a cross-sectional view depicting a trench MOSFET having a thick bottom oxide layer above a lightly doped embedded region and double polycide layers, in accordance with an embodiment.
Figure 24A:
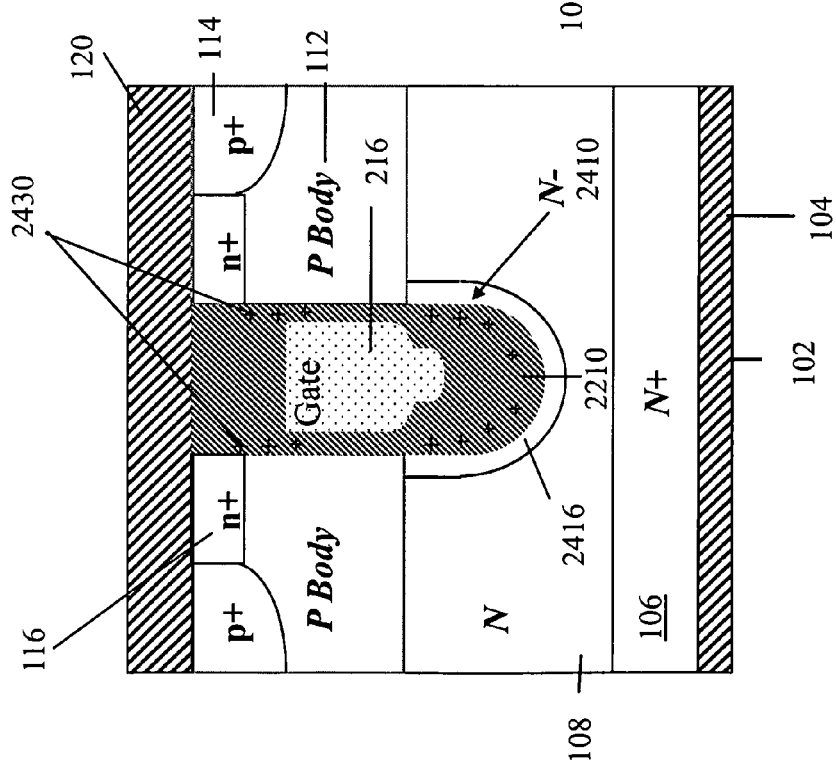
FIG. 24(a) is a cross-sectional view depicting a trench MOSFET having a thick bottom oxide layer above a lightly doped embedded region, in accordance with an embodiment.

With reference to FIG. 24(*a*), a cross-sectional view depicts an n-channel MOSFET 2400 in accordance with an embodiment. MOSFET 2400 may be characterized as having a drain lead 102 on a backside contact 104. A heavily doped drain region 106 adjoins a backside contact 104. A drain 108 is separated from a source 116 by a body 112. A gate insulation layer 2210 is formed in a trench containing a gate 216. Gate insulation layer 2210 may extend to a source and body metallization 120. The source and body metallization 120 contacts a source lead 116. Body contact regions 114 are adjacent to the body 112. An embedded permanent charge 2430 may be provided within a gate insulation layer 2210, approaching the junction between the gate insulation layer 2210, the body 112, and the source 116. The permanent charges 2430 may typically be positioned at a distance from the gate electrode 216. The permanent charge 2430 forms an inversion layer as previously described. The power MOSFET 2400 includes a gate-source offset and a thickened gate bottom dielectric 2210 such as oxide. A depleted trench boundary region 2410 may typically consisted of a lightly N doped region in proximity to embedded positive charges 2416 in the gate insulation layer 2210. Since the density of carriers at the bottom corner of the gate is reduced, the depleted region reduces the gate-to-drain capacitance Cgd.

With reference to FIG. 24(*b*), a cross-sectional view depicts an n-channel MOSFET 2401 in accordance with an embodiment. MOSFET 2401 may be characterized as having a drain lead 102 on a backside contact 104. A heavily doped drain region 106 adjoins a backside contact 104. A drain 108 is separated from a source 116 by a body 112. A gate insulation layer 2210 is formed in a trench containing a gate 216. Gate insulation layer 2210 may extend to a source and body metallization 120. The source and body metallization 120 contacts a source lead 116. Body contact regions 114 are adjacent to the body 112. An embedded permanent charge 2430 may be provided within a gate insulation layer 2210, approaching the junction between the gate insulation layer 2210, the body 112, and the source 116. The permanent charges 2430 may typically be positioned at a distance from the gate electrode 216. The power MOSFET 2401 includes a gate-source offset and a thickened gate bottom dielectric 2210 such as oxide. A depleted trench boundary region 2416 may typically consisted of a lightly N doped region in proximity to embedded positive charges 2410 in the gate insulation layer 2210. The power MOSFET 2401 may include a double polysilicon layer 216 and 924 in which the first polysilicon layer 924 is electrically connected to the source metal 120.

Figure 25A:
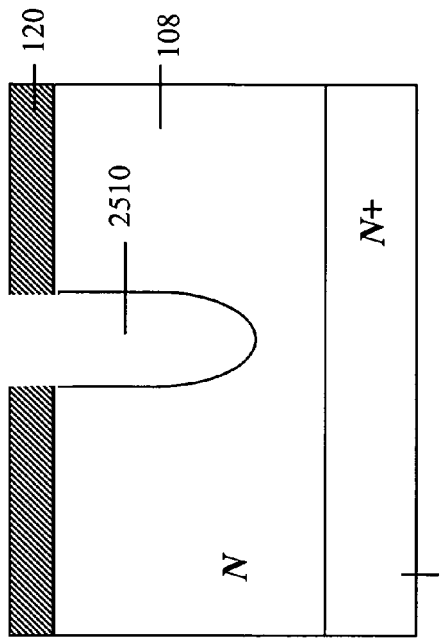
FIGS. 25(a)-25(h) are cross-sectional views depicting a series of steps in a method making a trench MOSFET, in accordance with an embodiment.
Figure 25B:
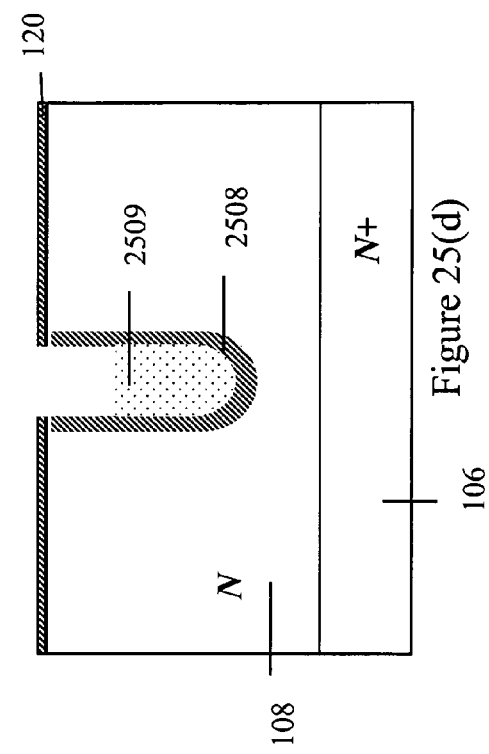
Figure 25C:
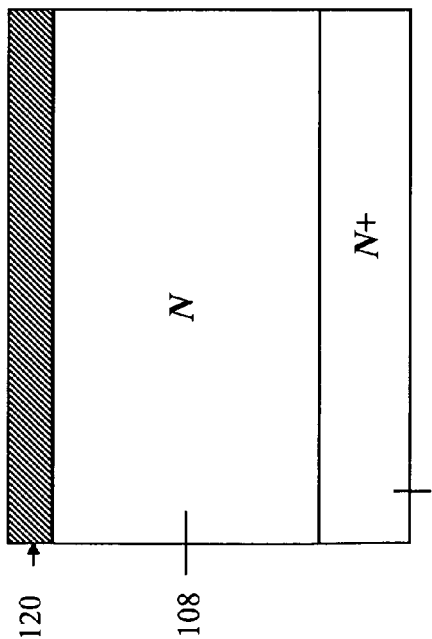
Figure 25D:
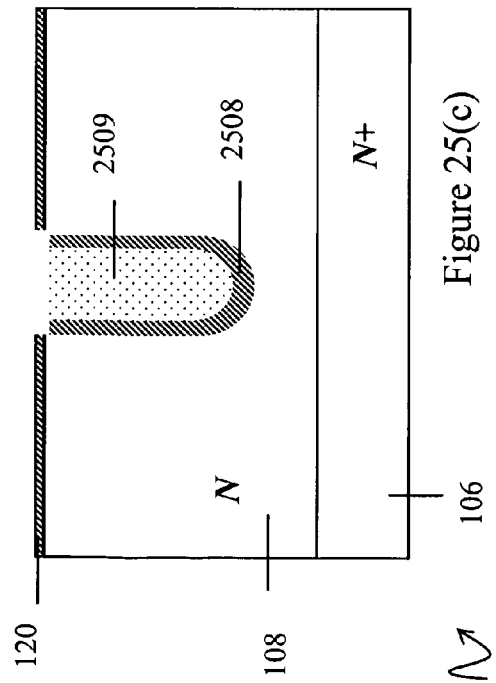
Figure 25E:
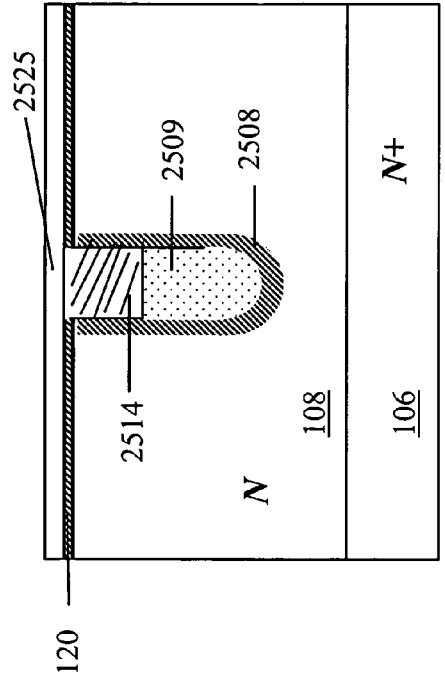
Figure 25:
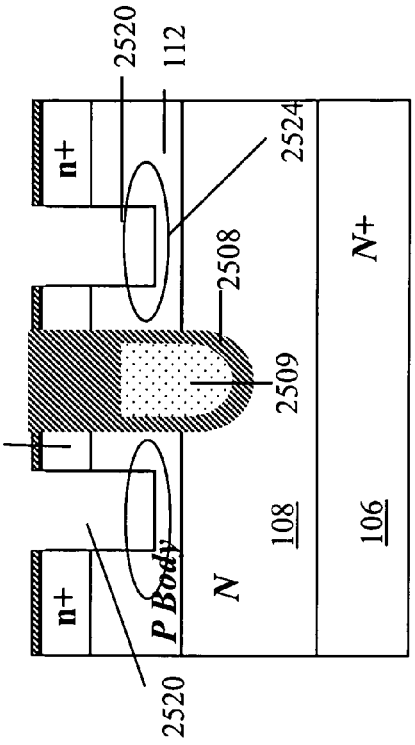
FIG. 25(i) is a cross-sectional view depicting a trench MOSFET, in accordance with an embodiment.
Figure 25G:
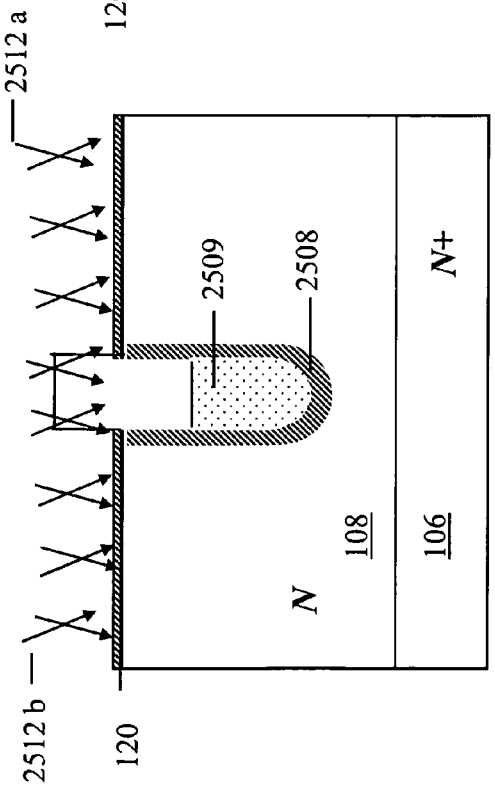
Figure 25H:
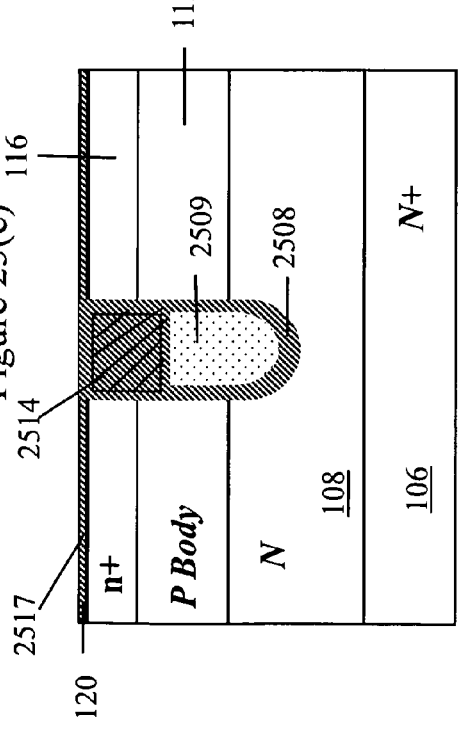
Figure 25:
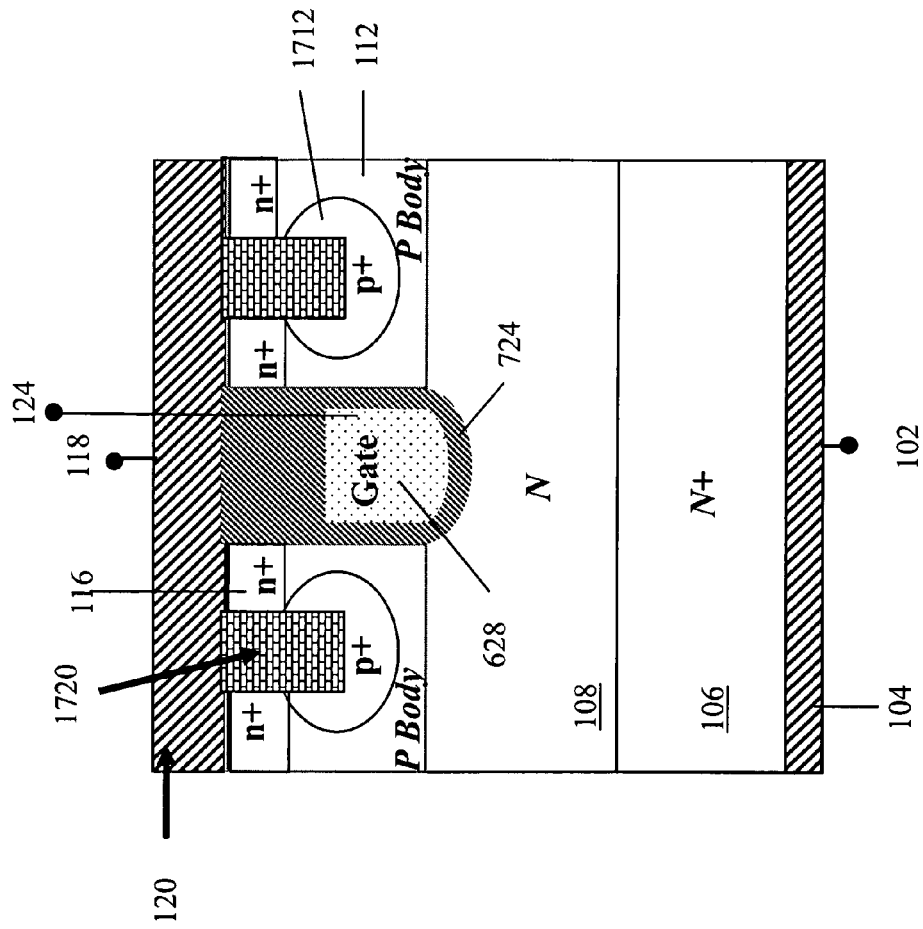

With reference to FIGS. 25(*a*)-(*i*), cross-sectional views depict a progression of stages in a process of fabricating an embodiment.

A starting material 106 is a heavily doped N+ substrate doped, for example, with phosphorus or arsenic. An n-type epitaxial layer 108 is grown on top of the N+ substrate 106. As shown in FIG. 25(*a*), an oxide layer 120 is grown and/or deposited over the epitaxial layer 108. The oxide layer 120, for example, may be 3000 Å-5000 Å thick.

With reference to FIG. 25(*b*), a photoresist mask is used to etch the oxide 120 and silicon layers 106 and 108. A trench 2510 is then etched.

With reference to FIG. 25(*c*), a thin thermal oxide layer 2508 is grown, e.g. 200 Å to 1000 Å thick and polysilicon 2509 is deposited, doped and etched back as shown in FIG. 25(*d*).

With reference to FIG. 25(*e*), cesium 2512*a* and 2512*b* may be implanted using appropriate angles, introducing permanent charges in the gate insulator.

With reference to FIG. 25(*f*), a thick dielectric layer 2514 is deposited, etched back and capped with a polysilicon or nitride layers 2525. Then the implant in annealed using rapid thermal annealing (RTA) or a furnace.

With reference to FIG. 25(*g*), the polysilicon or nitride layers are removed using etch techniques and n+ source 116 and p-body 112 implanted and a thin layer 2517 of silicon dioxide, or another dielectric, is formed on the surface.

With reference to FIG. 25(*h*), contacts 2520 are etched P+ contacts 2524 are implanted an annealed, and metal or silicide deposition and etching steps are then performed to yield the structure shown in FIG. 25(*i*). Drain contact layer 104 and drain lead 102, source and body lead 118, gate lead 124 and source and body metallization 120 are formed as well.

Figure 26B:
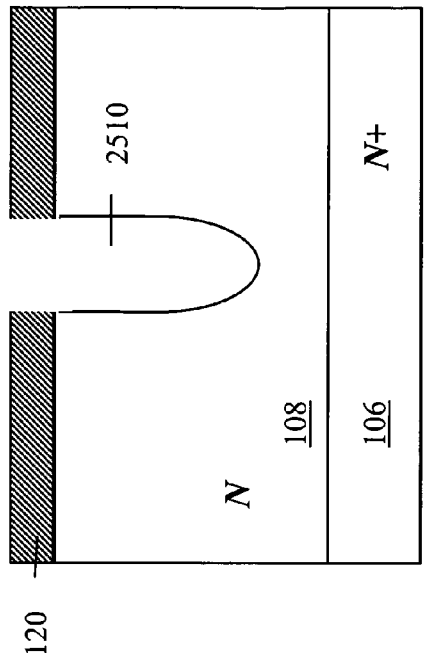
FIGS. 26(a)-(h) are cross-sectional views depicting a series of steps in a method of making a trench MOSFET, in accordance with an embodiment.
Figure 26D:
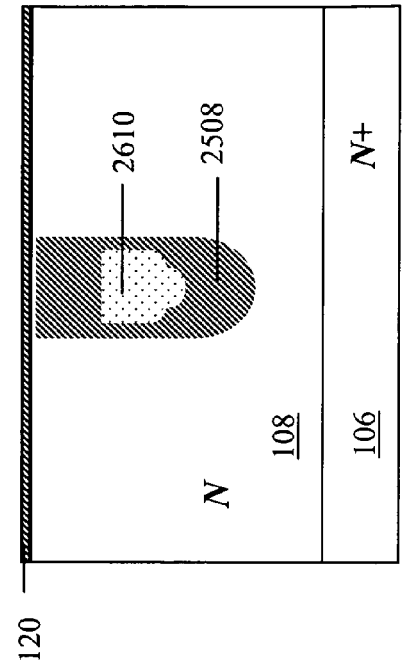
Figure 26A:
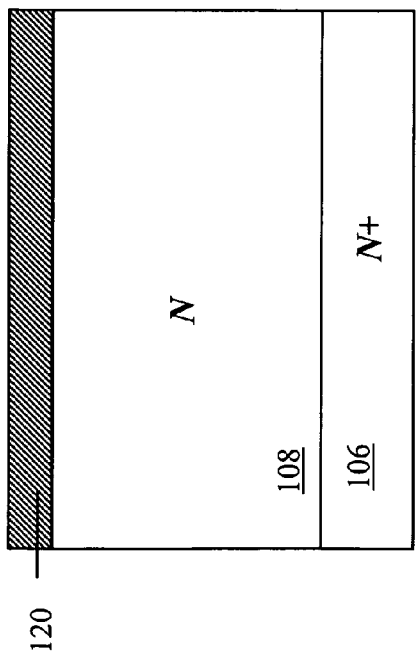
Figure 26C:
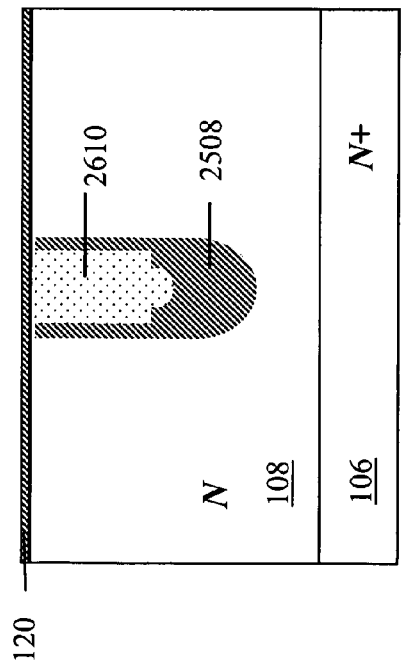
Figure 26G:
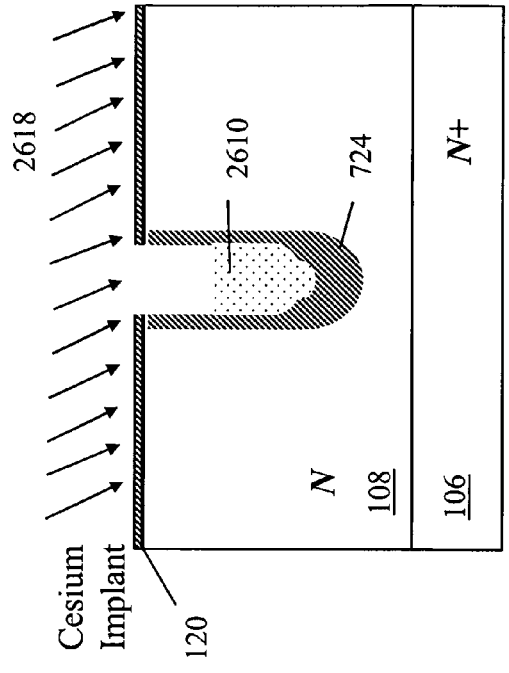
Figure 26H:
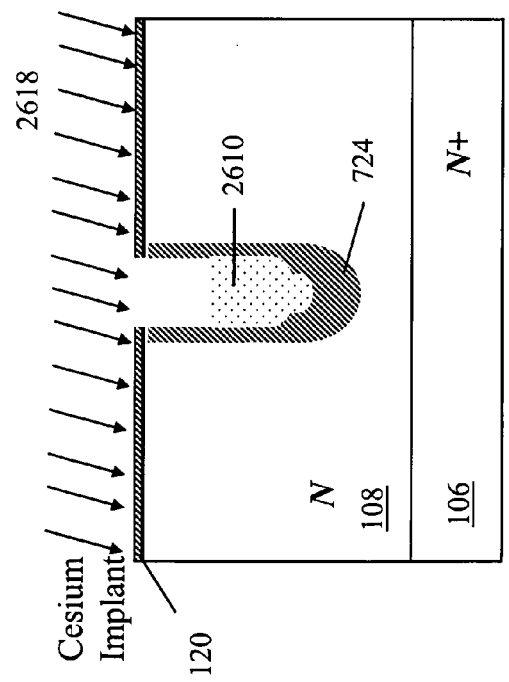
Figure 26E:
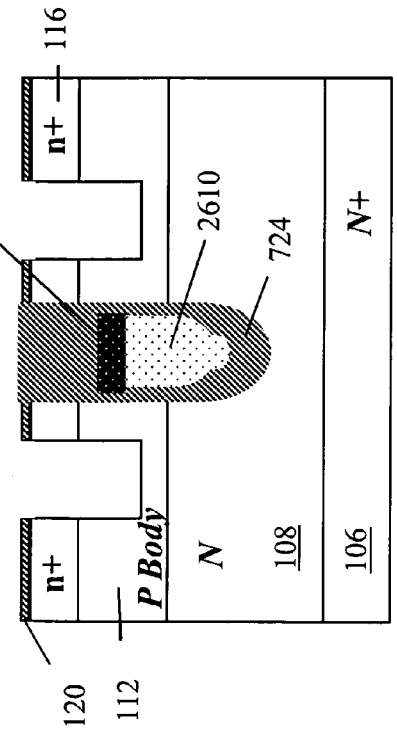
Figure 26F:
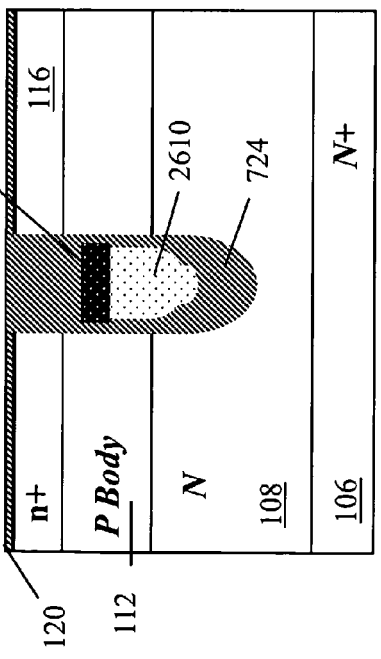
Figure 26:
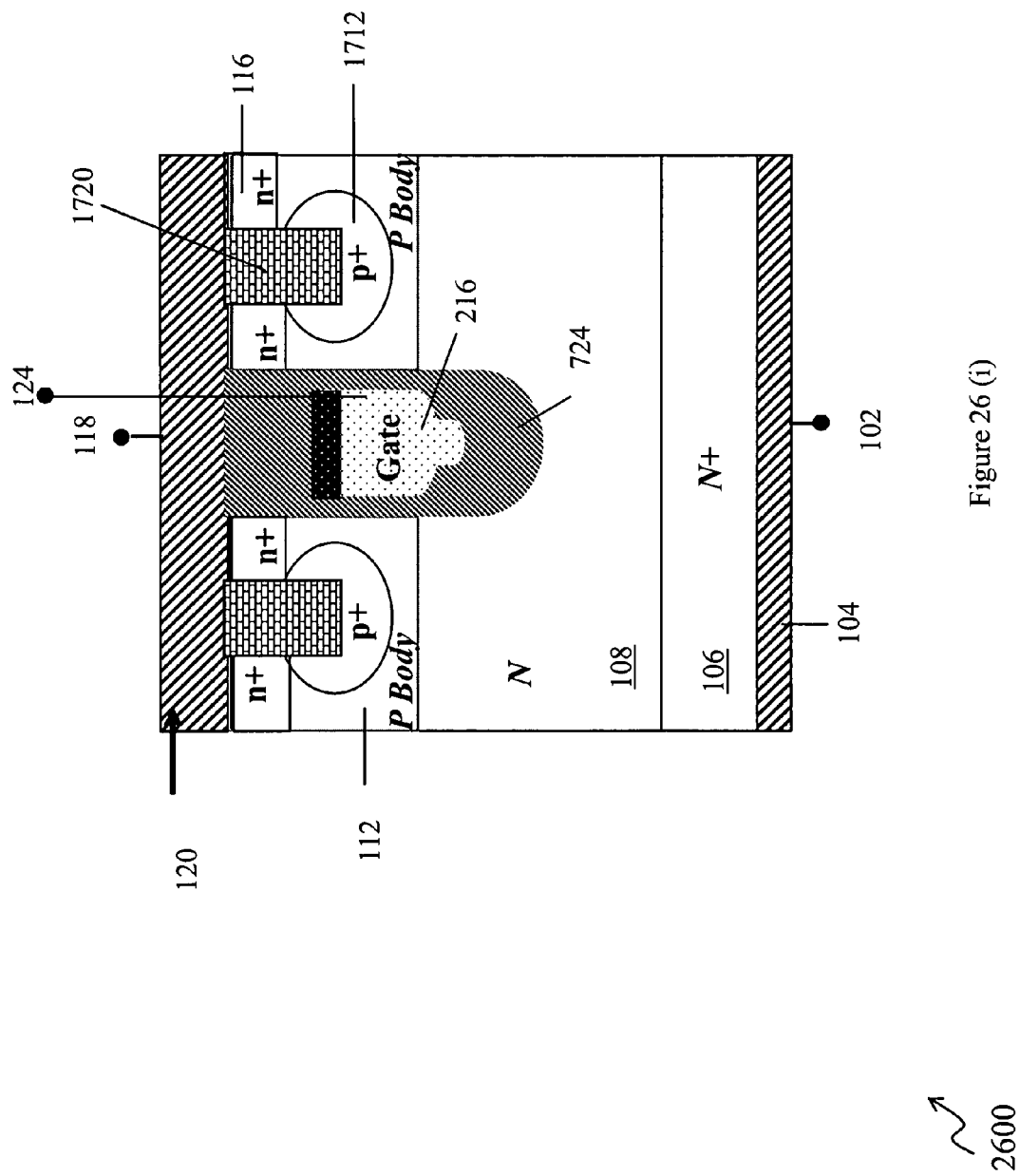
FIG. 26(i) is a cross-sectional view depicting a trench MOSFET, in accordance with an embodiment.

With reference to FIGS. 26(*a*)-(*i*), cross-sectional views depict stages in a process of fabricating an embodiment. The method is similar to that shown in FIG. 25 except that a thick bottom oxide 2508 is formed using either a double trench etch and LOCOS (local oxidation of silicon) technique or full oxidation and etch technique. Gate oxide 2508 is grown and polysilicon 2610 is deposited in trench 2510 and etched to a level approximately equal to the silicon surface. Polysilicon is further etched back and cesium 2618 is implanted using an appropriate angle as shown in FIGS. 26(*e*) and (*f*). A silicidation process forms a polycide layer 732 and the trench is filled by depositing a thick dielectric layer and etching it back as shown in FIG. 26(*g*). Source 116 and p-body 112 regions are then formed. Contact trenches are etched as shown in FIG. 26(*h*) and metal deposition and etching steps are then performed to yield the structure shown in FIG. 26(*i*). Contacts 1720, drain contact layer 104, source and body metallization 120, source and body lead 118, gate lead 124, and drain lead 102 are formed.

According to various disclosed embodiments, there is provided a vertical device structure comprising: a volume of semiconductor material, laterally adjoining a trench having insulating material on sidewalls thereof; and a gate electrode within said trench, which is capacitively coupled through said insulating material to a first portion of said semiconducting material; wherein at least some portions of said insulating material contain fixed electrostatic charge in a density high enough to deplete a second portion of said semiconductor material when no voltage is applied.

According to various disclosed embodiments, there is provided a device comprising: a trench having insulation material on sidewalls thereof; semiconductor material adjacent to said trench and having first and second portions; a gate electrode capacitively coupled through said insulation material to said first portion of said semiconductor material; a source electrode adjoining said second portion of said semiconductor material, wherein said source electrode is vertically offset from said gate electrode, such that the first portion of said semiconductor material adjoins said second portion of said semiconductor material; wherein said insulation material has at least some portions containing fixed electrostatic charge, said fixed electrostatic charge having a charge density sufficient to deplete said second portion of said semiconductor material in the absence of applied voltage.

According to various disclosed embodiments, there is provided a device structure comprising: a first-conductivity type source region; a second-conductivity type body region, underlying said source region; an insulated gate electrode which lies in a trench and which is capacitively coupled to said body region, at a sidewall of said trench, to controllably invert said body region at said sidewall, and thereby allow majority carriers to flow from said source region through said body region; and a charged dielectric region above said insulated gate electrode in said trench.

According to various disclosed embodiments, there is provided a semiconductor active device comprising: a source region of a first conductivity type, positioned in proximity to a first trench in semiconductor material; a second conductivity type body region at least partly underlying said source region, and at least partly adjoining said trench; an insulated gate electrode inside part of said trench, and capacitively coupled to said body region at a sidewall of said trench to controllably invert said body region at said sidewall and thereby allow majority carriers to flow from said source region through said body region; a distribution of net electrostatic charge located in said trench at least some locations where said gate electrode is not present, in a density sufficient to deplete at least part of said body region; and a first conductivity type drain region underlying at least part of said body region.

According to various disclosed embodiments, there is provided a semiconductor device structure comprising: a source electrode; a body region in contact with said source electrode; a dielectric material adjoining said body region; a first gate electrode and a second gate electrode embedded within said dielectric material wherein said second gate electrode is electrically connected to said source electrode and said body region; and a fixed electrostatic charge embedded within said dielectric material near the source electrode and the body region.

According to various disclosed embodiments, there is provided a power MOSFET structure comprising: a source region; a body region adjoining said source region; a drain region adjoining said body region; a trench region formed of insulator material and adjacent said source region and said body region and said drain region; a gate electrode in said trench region; a fixed electrostatic charge within said trench region at a junction between said body region and said trench region from between about a vertical level of a lower surface of a gate electrode and a junction between said body region and said drain region and said trench region and increasing the depletion of the body region when no voltage is applied to the gate electrode.

According to various disclosed embodiments, there is provided a semiconductor power switch device structure comprising: a source region; a body region adjoining said source region; a trench region adjoining said source region and said body region; a gate electrode within said trench region and offset from said source region; a first fixed electrostatic charge within said trench region near a junction of said source region and said body region, said first fixed electrostatic charge increasing depletion in said body region when no voltage is applied to said gate electrode; a drain region adjoining said body region and said trench region; a second fixed electrostatic charge within said trench region near a junction of said body region and said drain region.

According to various disclosed embodiments, there is provided a power switch device structure comprising: a source region; a body region adjoining said source region; a trench region formed with a dielectric material, said trench region adjoining said source region and said body region; a gate electrode within said trench region and vertically offset from said source region, said gate electrode having a silicided upper portion; and a fixed electrostatic charge within said dielectric material in said trench region.

According to various disclosed embodiments, there is provided a semiconductor device structure comprising: a source region of a first conductivity type; a body region of a second conductivity type and adjoining said source region; a trench region formed with a dielectric material, said trench region adjoining said source region and said body region; a gate electrode within said trench region and vertically offset from said source region, said gate electrode having a silicided upper portion; and a fixed electrostatic charge of said first conductivity type within said dielectric material in said trench region.

According to various disclosed embodiments, there is provided a method for operating a semiconductor device, comprising the actions of: controlling majority carrier flow from a source region, through a body region and into a drift region, using voltages applied to a gate electrode which is capacitively coupled to at least part of said body region to define a channel therein; and statically inverting a portion of said body, using permanent electrostatic charge at a semiconductor/dielectric interface of said body region, to thereby form an induced source extension therein, which connects said source region to said channel.

According to various disclosed embodiments, there is provided a power device structure comprising: a heavily doped source region having a first conductivity type; a body region in contact with said heavily doped source region, said body region having a second conductivity type; a trench region of a dielectric material adjoining said heavily doped source region and said body region; a first gate electrode within said trench region; a second gate electrode within said trench region; a fixed electrostatic charge of said second conductivity type, within said trench region and positioned to effect depletion in the body region; and a recessed field plate.

According to various disclosed embodiments, there is provided a semiconductor power device structure comprising: a source region having a first conductivity type; a body region adjoining said source region, said body region having a second conductivity type; a trench region comprising an insulation material, adjoining said source region and said body region; a gate electrode within said trench region; a first fixed electrostatic charge positioned in said trench region between an upper surface of said gate electrode and the source region; a drain region having a first conductivity type and adjoining said body region and said trench region; and a second fixed electrostatic charge positioned in the trench region at a junction with said drain region.

According to various disclosed embodiments, there is provided a process for making a device structure, comprising:

etching a trench into semiconductor material, and forming sidewall insulation therein; forming at least one gate electrode in said trench; introducing permanent charge into said sidewall insulation above said gate electrode; and forming a source region which has a conductivity type opposite to that of said semiconductor material adjacent to said gate electrode; wherein said permanent charge is introduced with a concentration, in said sidewall insulation, which is sufficient to invert said semiconductor material adjacent thereto.

According to various disclosed embodiments, there is provided a vertical device structure which includes a volume of semiconductor material, laterally adjoining a trench having insulating material on sidewalls thereof. A gate electrode within the trench is capacitively coupled through the insulating material to a first portion of the semiconducting material. Some portions of the insulating material contain fixed electrostatic charge in a density high enough to deplete a second portion of the semiconductor material when no voltage is applied.

According to various disclosed embodiments, there is provided a process for making a device structure comprising: providing a heavily doped N+ substrate; growing an n-type epitaxial layer on N+ substrate; growing an oxide layer (300-500 nm) over epitaxial layer; etching a trench; double etching the trench (LOCOS, full oxidation); growing a thermal oxide layer (e.g. 20-100 nm); depositing, doping and etching back polysilicon; angle-implanting cesium; depositing a thick dielectric layer, and capping with layer (polysilicon, nitride); annealing implant damage (rapid thermal anneal or furnace); removing the layer; forming n+ source and p-body diffusions, e.g. by implanting; etching contacts, and depositing and patterning metal.

According to various disclosed embodiments, there is provided a process for making a device structure comprising: heavily doped N+ substrate (phosphorus or arsenic) grow an n-type epitaxial layer on N+ substrate; grow an oxide layer over epitaxial layer (3000 Å-5000 Å); etch trench; double etch trench (LOCOS, full oxidation); grow thermal oxide layer (200 Å-1000 Å); deposit polysilicon; dope polysilicon; etch back polysilicon; angle implant cesium; deposit thick dielectric layer; cape with layer (polysilicon, nitride); anneal implant (rapid thermal anneal or furnace); remove layer; implant n+ source; implant p-body; etch contacts; deposit metal; and etch.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

Numerous variations of the MOSFETs described above are within the scope of the various claimed inventions. A stepped oxide may line the gate trench and/or the RFP trench. Quasi-vertical designs can be implemented as well as vertical MOSFETs.

In the above drawings, charge has generally been shown inside the dielectric for illustration purposes. However, it will be understood that the charges can be in the dielectric at the interface between the silicon and silicon dioxide, inside the silicon interface layer, or a combination of all these cases.

It is understood that the permanent charge may be of either polarity, i.e., positive charges may replace negative charges and vice-versa, as the conductivity types ("p" and "n") in the devices are reversed.

Similarly, while the preferred embodiment is implemented in silicon, a variety of semiconductor materials can alternatively be used. For example, SiGe or SiGeC are possible alternatives.

All of the above variants of the structure may be realized in stripe or a cellular layout, such as square, rectangular, hexagonal or circular layouts.

The following applications may contain additional information and alternative modifications: Ser. No. 61/065,759 filed Feb. 14, 2008 and entitled "Highly Reliable Power MOSFET with Recessed Field Plate and Local Doping Enhanced Zone"; Ser. No. 61/058,069 filed Jun. 2, 2008 and entitled "Edge Termination for Devices Containing Permanent Charge"; Ser. No. 61/060,488 filed Jun. 11, 2008 and entitled "MOSFET Switch"; Ser. No. 61/074,162 filed Jun. 20, 2008 and entitled "MOSFET Switch"; Ser. No. 61/076,767 filed Jun. 30, 2008 and entitled "Trench-Gate Power Device"; Ser. No. 61/125,892 filed Apr. 29, 2008 and entitled "Edge Termination for PN Junction Having Sub-Micron Junction Dept"; Ser. No. 61/084,639 filed Jul. 30, 2008 and entitled "Lateral Devices Containing Permanent Charge"; Ser. No. 61/084,642 filed Jul. 30, 2008 and entitled "Silicon on Insulator Devices Containing Permanent Charge"; Ser. No. 61/027,699 filed Feb. 11, 2008 and entitled "Use of Permanent Charge in Trench Sidewalls to Fabricate Un-Gated Current Sources, Gate Current Sources, and Schottky Diodes"; Ser. No. 61/028,790 filed Feb. 14, 2008 and entitled "Trench MOSFET Structure and Fabrication Technique that Uses Implantation Through the Trench Sidewall to Form the Active Body Region and the Source Region"; Ser. No. 61/028,783 filed Feb. 14, 2008 and entitled "Techniques for Introducing and Adjusting the Dopant Distribution in a Trench MOSFET to Obtain Improved Device Characteristics"; Ser. No. 61/091,442 filed Aug. 25, 2008 and entitled "Devices Containing Permanent Charge"; Ser. No. 61/118,664 filed Dec. 1, 2008 and entitled "An Improved Power MOSFET and Its Edge Termination"; and Ser. No. 61/122,794 filed Dec. 16, 2008 and entitled "A Power MOSFET Transistor".

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:
1. A device comprising:
a trench having a dielectric material on sidewalls thereof;
semiconductor material adjacent to said trench;
a gate electrode capacitively coupled through said dielectric material to a first portion of said semiconductor material;
a source electrode adjoining a second portion of said semiconductor material which adjoins said first portion of said semiconductor material;
wherein said dielectric material has at least some portions containing fixed electrostatic charge with a charge den- sity at least sufficient to invert said second portion of said semiconductor material in the absence of applied voltage.

2. The device structure of claim 1, further comprising a source region, wherein an upper surface of said dielectric material is flush with an upper surface of said source region.

3. The device structure of claim 2, further comprising a source region and a drain region, separated from each other by at least said first portion of said semiconductor material.

4. The device structure of claim 1, further comprising a body contact region adjoining said semiconductor material.

5. The device of claim 1, wherein said dielectric material below the gate electrode is substantially thicker than the dielectric material between the gate electrode and the semiconductor material.

6. The device of claim 1, wherein an upper surface of said dielectric material is above an upper surface of said source electrode.

7. The device of claim 1, wherein an upper surface of said dielectric material is flush with an upper surface of said source electrode.

8. A semiconductor active device comprising:
a source region of a first conductivity type, positioned in proximity to a first trench in semiconductor material;
a second conductivity type body region at least partly underlying said source region, and at least partly adjoining said trench;
an insulated gate electrode inside part of said trench, and capacitively coupled to said body region at a sidewall of said trench to controllably invert said body region at said sidewall and thereby allow majority carriers to flow from said source region through said body region;
a distribution of net electrostatic charge located in said trench at some locations where said gate electrode is not present, in a density sufficient to invert at least part of said body region independently of said gate electrode; and
a first conductivity type drain region underlying at least part of said body region.

9. The device of claim 8, wherein said trench below the insulated gate electrode is substantially thicker than the trench between the gate electrode and the semiconductor material.

10. The device of claim 8, wherein said source electrode is vertically offset from said gate electrode.

11. The device of claim 10, wherein said insulated gate electrode includes a smooth transition region at a bottom edge of said insulated gate electrode.

12. The device of claim 8, wherein said insulated gate electrode includes a smooth transition region at a bottom edge of said insulated gate electrode.

13. The device of claim 8, wherein the body region adjoining dielectric material predominantly comprising silicon dioxide.

14. The device of claim 13, further comprising a fixed electrostatic charge in the dielectric material near the gate electrode.

15. The device of claim 8, said insulated gate electrode includes a polycide layer.

16. The semiconductor device structure of claim 8, further comprising a recessed field plate.

17. The semiconductor device structure of claim 8, further comprising trench contacts.

* * * * *